United States Patent [19]
Nishimoto et al.

[11] Patent Number: 6,096,966
[45] Date of Patent: *Aug. 1, 2000

[54] TUBULAR THERMOELECTRIC MODULE

[75] Inventors: Seiji Nishimoto; Taku Kitayama; Yoshikazu Fujisawa, all of Saitama, Japan

[73] Assignee: Honda Giken Kogyo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/900,419

[22] Filed: Jul. 25, 1997

[30] Foreign Application Priority Data

Jul. 26, 1996 [JP] Japan ..................... 8-197432

[51] Int. Cl.⁷ ..................... H01L 35/30
[52] U.S. Cl. ............ 136/205; 136/203; 136/208
[58] Field of Search .................. 136/201, 203, 136/210, 211, 212, 208, 205, 236.1; 252/62.3 T

[56] References Cited

U.S. PATENT DOCUMENTS

| | | | |
|---|---|---|---|
| 2,798,989 | 7/1957 | Welker | 317/237 |
| 4,007,061 | 2/1977 | Le Couturier | 136/221 |
| 4,095,998 | 6/1978 | Hanson | 136/208 |
| 5,875,098 | 2/1999 | Leavitt et al. | 361/708 |

OTHER PUBLICATIONS

CRC Handbook of Thermoelectrics (Rowe, D.M, Ph.D., D.Sc., CRC Press, p. 658), 1995.

*Primary Examiner*—Kathryn Gorgos
*Assistant Examiner*—Wesley A. Nicolas
*Attorney, Agent, or Firm*—Lyon & Lyon LLP

[57] ABSTRACT

A thermoelectric module having a high thermoelectric performance is shown and described. A flat thermoelectric module comprises a multi-layered body provided with a thermoelectric material layer having output take-out faces on two opposite sides, an electrode layer present on each output take-out faces, a metallic layer present on each electrode layer, and an electrical insulating outer layer covering the surface of the body. Adjacent layers are pressure-welded to be in close contact with each other. No solder is used in the construction of a module in accordance with the present invention, and it is therefore possible to improve the thermoelectric performance of the module by raising the operating temperature without being restricted by the melting point of solder.

20 Claims, 27 Drawing Sheets

TUBULAR THERMOELECTRIC MODULE

FIELD OF THE INVENTION

The present invention relates to thermoelectric modules, and more particularly, to a thermoelectric module made of a thermoelectric material that is capable of converting thermal energy into electric energy and vice versa.

BACKGROUND OF THE INVENTION

Conventionally known thermoelectric modules are made by alternately arranging a large number of p-type thermoelectric semiconductors (hereafter referred to as p-type semiconductors) and a large number of n-type thermoelectric semiconductors (hereafter referred to as n-type semiconductors) in series and connecting adjacent p-type and n-type semiconductors to each other through an electrode to form a p-n junction structure. The p-n junction structure is then combined with a heat absorbing body to serve as a heat exchanger (see Japanese Patent Application Laid-Open No. 63-262075).

However, a conventional thermoelectric module has numerous shortcomings. For example, the temperature distribution of its heat absorbing body easily becomes non-uniform and such that if a temperature difference is produced between p-type and n-type semiconductor junctions present at different positions in the same module, the internal resistance between p-n junctions in the thermoelectric module varies. This variation of the internal resistance causes the entire internal resistance of the thermoelectric module to increase, such that the thermoelectric performance of the module deteriorates. This problem occurs not only in the same module but also between different modules when using a plurality of thermoelectric modules.

Moreover, because an electrode in conventional modules is soldered with a p-type or n-type semiconductor and the solder has a relatively low melting point, the operating temperature of the thermoelectric module is relatively low. It is therefore impossible to completely improve the thermoelectric performance of the thermoelectric module.

Furthermore, the production cost of conventional thermoelectric modules is high due to the complexity of p-n junction structures and the large number of parts that are required.

In addition, such a conventional thermoelectric module lacks in reliability because the operation of the module stops when even one of many p-n junctions is disconnected, since the junctions are connected in series.

A need therefore exists for a thermoelectric module having a high thermoelectric performance, simple structure, low production cost, and high reliability. The present invention fulfills these needs, and provides further related advantages.

SUMMARY OF THE INVENTION

Briefly, the present invention provides a thermoelectric module having a high, reliable thermoelectric performance that is simple and cost effective to manufacture. In a preferred embodiment, a thermoelectric module has a layer-built body provided with a thermoelectric material layer having output take-out faces on two opposite sides. An electrode layer is present on each output take-out face, and a highly heat-conductive material layer is present on each electrode layer. All of the adjacent layers are in close contact with each other, and the layer-built body is provided with an electrical insulating outer layer covering the surface thereof.

A thermoelectric module can be formed in one embodiment to be flat, and alternatively, to be tubular. The module may therefore be used as a unit of a heat transfer unit, thereby eliminating the need for a separate heat exchanger and simplifying the structure of a heat transfer unit provided with the thermoelectric module.

By constituting a thermoelectric module in accordance with the present invention, the module has a stable thermoelectric performance because it exhibits an internal resistance that depends on the average temperature of the whole of the module.

Moreover, in one embodiment, adjacent layers are in close contact with each other via use of a pressure-welding method, making the use of solder unnecessary. Therefore, it is possible to improve the thermoelectric performance of the thermoelectric module by raising the operating temperature, without being limited by the melting point of the solder.

Furthermore, because relatively few parts are required, the structure is simple, the production cost is low, and the reliability is high.

Also, because the heat transfer efficiency is high, a thermoelectric module can be downsized.

DETAILED DESCRIPTION OF THE INVENTION

Figure 1:
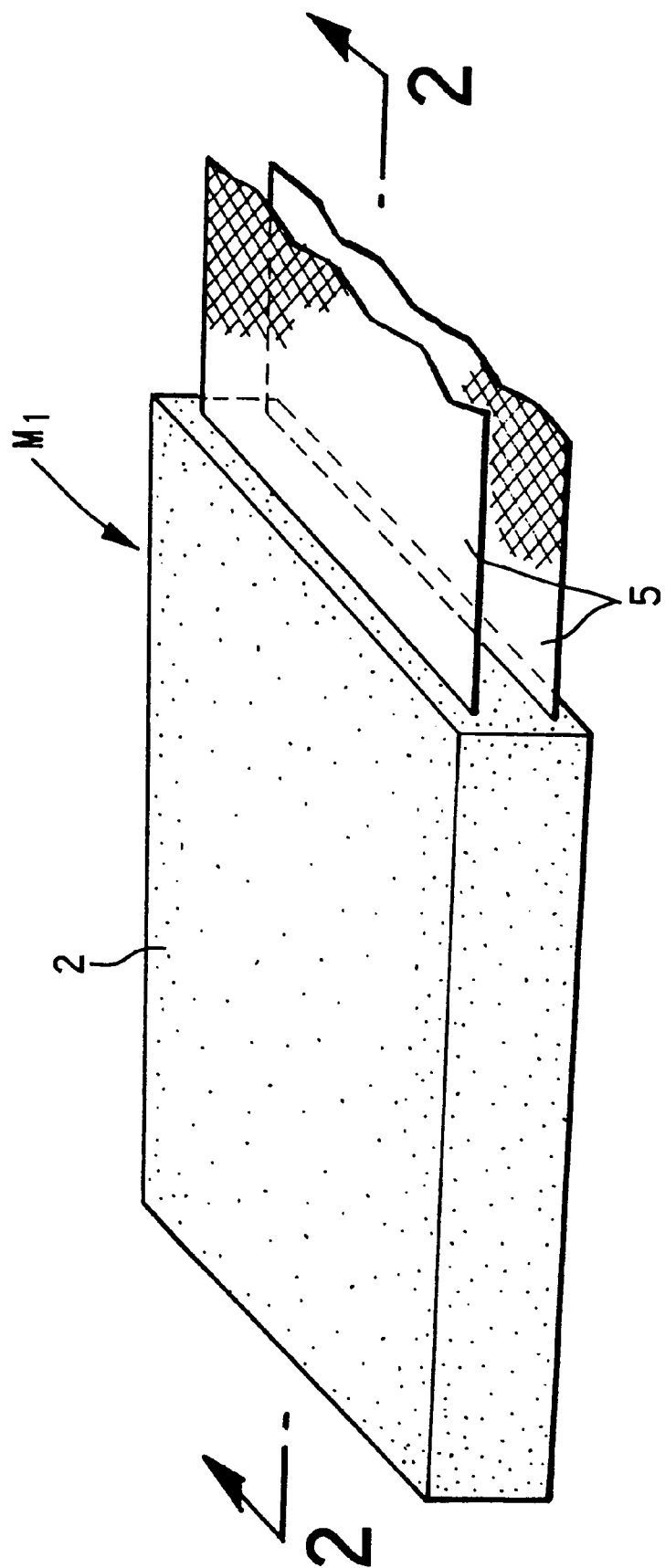
FIG. 1 is a perspective view of a first example of a flat thermoelectric module provided in accordance with the present invention.
Figure 2:
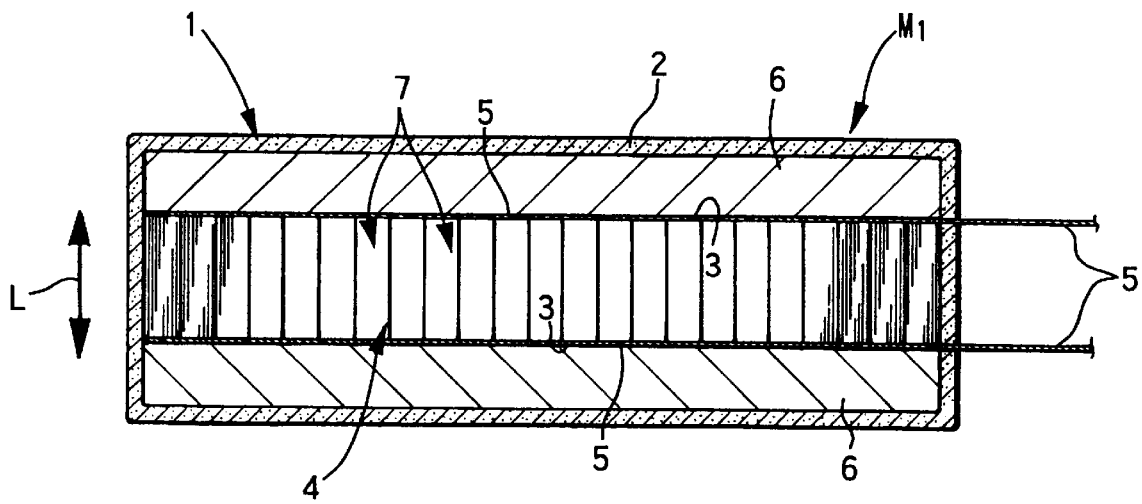
FIG. 2 is a sectional view of the module of FIG. 1, taken along the line 2—2 in FIG. 1.

A flat thermoelectric module $M_1$ shown in FIGS. 1 and 2 is provided with a flat, multi-layered body 1 having a rectangular shape. An electrical insulating outer layer 2 covers the entire surface of the body 1. The flat multi-layered body 1 comprises a thermoelectric material layer 4 having output take-out faces 3 on opposite sides, an electrode layer 5 present on each output take-out face 3, and a highly heat-conductive material layer 6 present on each electrode layer 5. The adjacent layers 4 and 5 and adjacent layers 5 and 6 are directly in close contact with each other by means of pressure-welding. The ends of the electrode layers 5 protrude from the outer layer 2 and serve as lead wires.

Figure 3:
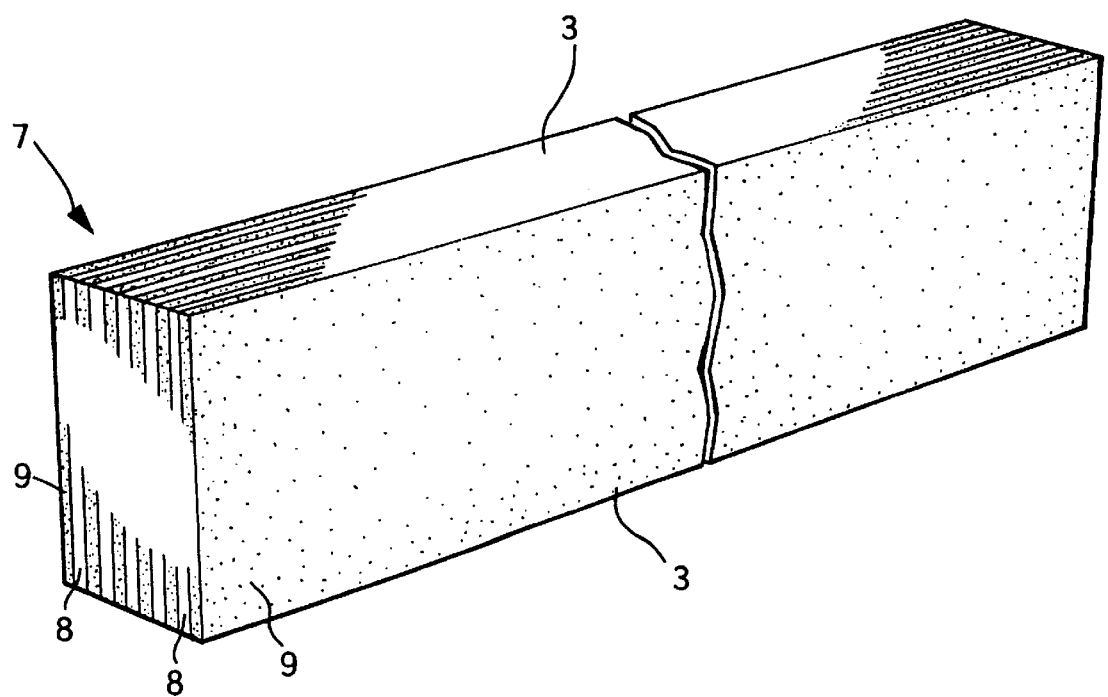
FIG. 3 is a perspective view of a thin-film layer-built unit of the module of FIG. 1.

The thermoelectric material layer 4 is formed by arranging a plurality of strip-like thin-film layer-built units 7 in parallel. As illustrated in FIG. 3, each thin-film layer-built unit 7 is formed by alternately superposing conductive layers 8 and barrier layers 9 and arranging barrier layers 9 on both outermost sides of the unit 7. In this case, it is possible for the thin-film layer-built unit 7 to have a substrate necessary for the thin-film forming step. In each thin-film layer-built unit 7, one face where the alternating conductive layers 8 and the barrier layers 9 are exposed and the face on the opposite side serve as the output take-out faces 3 which are in contact with the electrode layers 5.

Although a variety of materials may be used to form the various layers discussed above, examples of preferred, acceptable materials are noted below.

For example, the semiconductor forming the conductive layers 8 may be one of a p-type semiconductor such as $Fe_{0.9}Mn_{0.1}Si_2$[FeSi$_2$-based semiconductor], $(Si_{0.8}Ge_{0.2})B_{0.003}$[SiGe-based semiconductor], $(PbTe_{0.95}Se_{0.05})Na_{0.01}$ [PbTe-based semiconductor], or $(GeTe)_{0.85}(AgSbTe_2)_{0.15}$ [PbTe-based substitute semiconductor], an n-type semiconductor such as $Fe_{0.9}Co_{0.1}Si_2$[FeSi$_2$-based semiconductor], $(Si_{0.8}Ge_{0.002})P_{0.002}$[SiGe-based semiconductor], or $(Pb_{0.95}Ge_{0.005}Te)(PbI_2)_{0.001}$[PbTe-based semiconductor] and p-type and n-type BiTe-based semiconductor.

The semiconductor constituting the barrier layers 9 may be one of Si, FeSi$_2$[FeSi$_2$-based semiconductor], $Si_{0.8}Ge_{0.2}$ [SiGe-based semiconductor], and $(Pb_{0.9}Eu_{0.07})Te$[PbTe-based semiconductor].

Alternatively, it is also possible to use a bulk material such as a sintered body made of one of the above various types of semiconductors as the thermoelectric material layer 4.

When constituting the thermoelectric material layer 4 with a sintered body, it is also possible to form the three layers of the thermoelectric material layer 4 and both electrode layers 5, or the five layers of the thermoelectric material layer 4, both electrode layers 5, and both highly heat-conductive material layers 6, into one body by a powder metallurgy method such as a powder pressing method or powder injection molding method (MIM).

If a sintered body is used as the thermoelectric material layer 4 and worked in the temperature region in which the body exhibits a superplastic characteristic, the thermoelectric performance is improved.

Both electrode layers 5 are made of Cu or Al and are formed like a net or thin film (including a foil). Moreover, it is possible to use a printed circuit board as each electrode layer 5.

Both highly heat conductive material layers 6 are made of special steel such as mild steel or stainless steel, Cu, Al, Ti, or an alloy of them, a metallic composite material such as Mg alloy or FRM, or a non-metallic material such as AlN (aluminum nitride) or metallic-filler-containing resin and formed like, for example, a thin plate. One of the layers 6 functions as a heating portion and the other of them functions as a cooling portion or, the former functions as a heat-absorbing portion and the latter functions as a heat-radiating portion.

By using a soft metal such as Al as the highly heat-conductive material layer 6, it is possible to improve the adhesion between the highly heat-conductive material layers 6 and the thermoelectric material layer 4, and decrease the contact resistance, even if the electrode layers 5 are omitted. Therefore, in this case, it is possible to allow the highly heat-conductive material layers 6 to also serve as the electrode layers 5.

To manufacture the flat multi-layered body 1, the layers 4, 5, and 6 are superposed on each other to pressure-weld adjacent layers 4, 5 and 5, 6 to each other by using the uniaxial stress of pressing, rolling, extruding, drawing and the like or the hydrostatic pressure stress of rubber pressing, CIP, HIP and the like.

The electrical insulating outer layer 2 is made of ceramic such as $Al_2O_3$ or $ZrO_2$ or a polymer material. To form the outer layer 2, one of various dry or wet coating methods such as electrolytic plating, dipping, spraying and plasma spraying is used.

When such a flat thermoelectric module $M_1$ is used, it is necessary to bring one of the highly heat-conductive material layers 6 into contact with a heat source, cool the other, and thereby produce a temperature gradient in the direction L of the thickness of the thermoelectric material layer 4.

Figure 4:
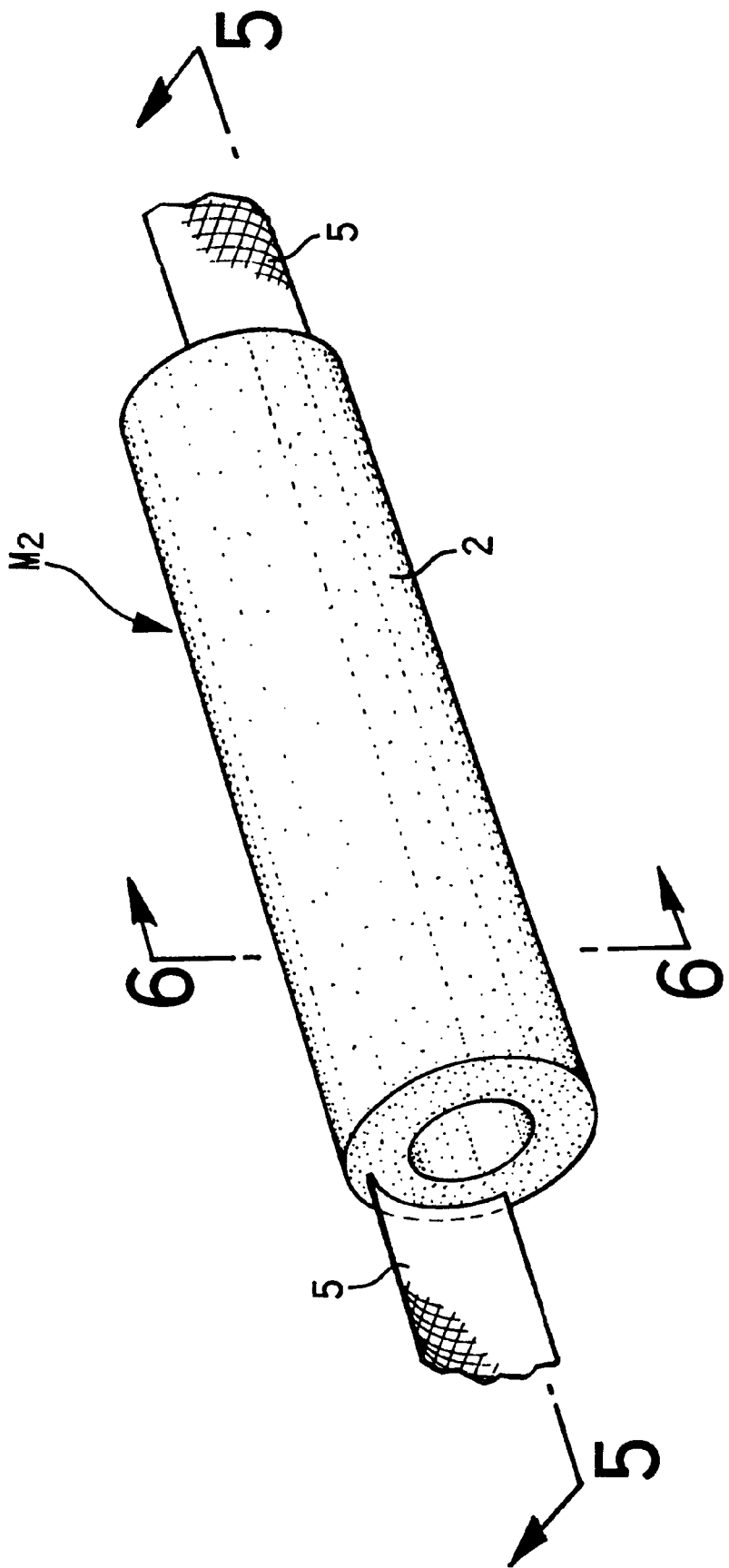
FIG. 4 is a perspective view of a first example of a tubular thermoelectric module provided in accordance with the present invention.
Figure 5:
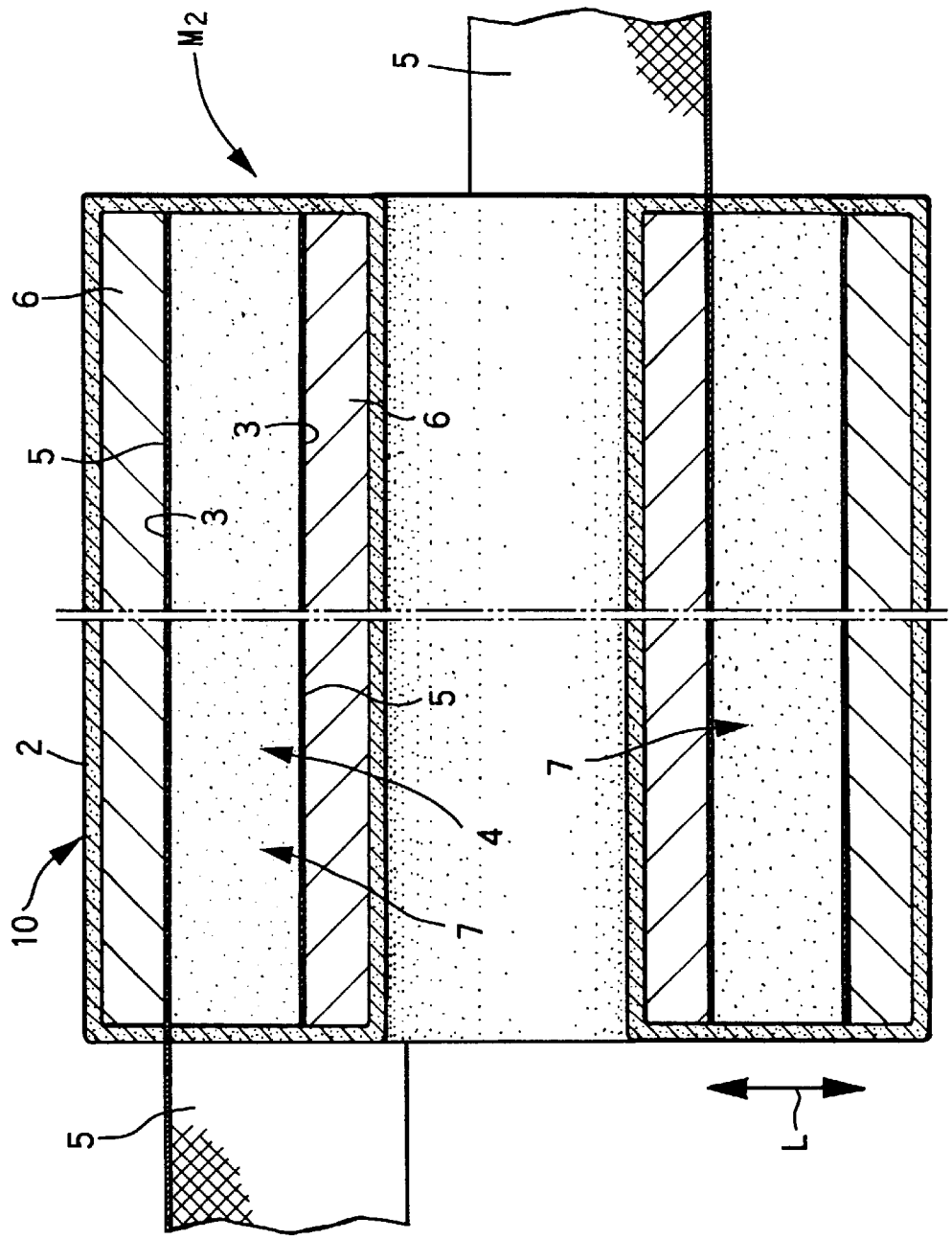
FIG. 5 is a sectional view of the module of FIG. 4, taken along the line 5—5 in FIG. 4.
Figure 6:
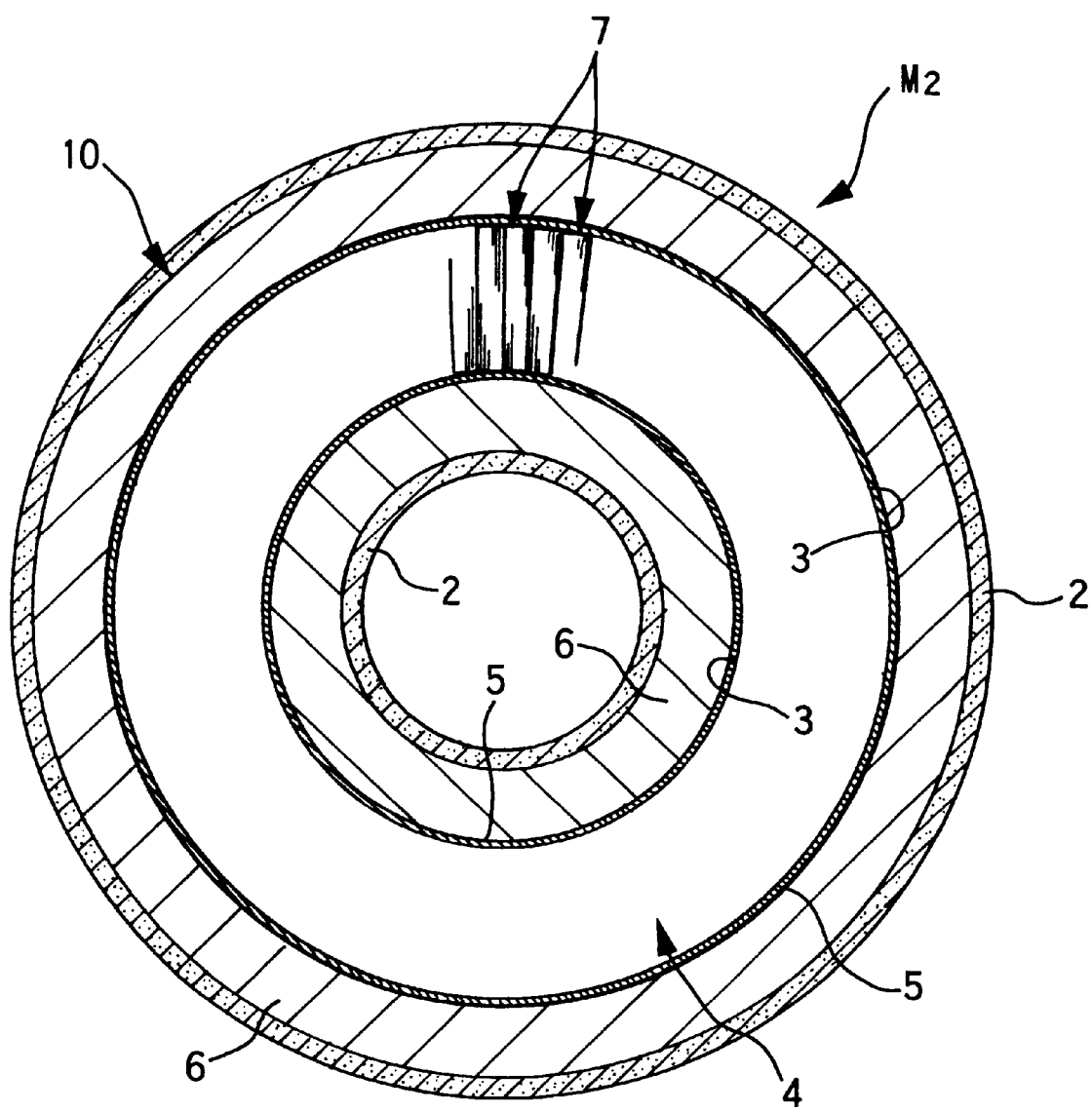
FIG. 6 is a sectional view of the module of FIG. 4, taken along the line 6—6 in FIG. 4.

The tubular thermoelectric module $M_2$ shown in FIGS. 4 to 6 is provided with a tubular multi-layer body 10 and an electrical insulating outer layer 2 covering the entire surface of the body 10, including the inner and outer peripheries and both annular end faces of the body 10. As illustrated in FIGS. 5 and 6, the tubular body 10 comprises an annular thermoelectric material layer 4 having output take-out faces 3 on the inner and outer peripheries thereof, an electrode layer 5 present on each output take-out face 3, and a highly heat-conductive material layer 6 present on each electrode layer 5. The adjacent layers 4, 5 and 5, 6 are directly in close contact with each other by pressure-welding. One end of each of the electrode layers 5 protrudes from the outer layer 2 and serves as a lead wire.

The thermoelectric material layer 4 is constituted by arranging a plurality of strip-like thin-film layer-built units 7 similar to the above concentrically and both output take-out faces 3 of the thin-film layer-built units 7 are in contact with the electrode layers 5.

The materials of the electrode layers 5, highly heat-conductive material layers 6, and outer layer 2 are the same as those of the flat thermoelectric module $M_1$.

When the tubular thermoelectric module $M_2$ is used, it is necessary to flow high-temperature fluid through the inside of the module, cool the highly heat-conductive material layer 6 on the outer periphery side, and thereby produce a temperature gradient in the layer-thickness direction L, that is, in the radial direction in the thermoelectric material layer 4.

Figure 7:
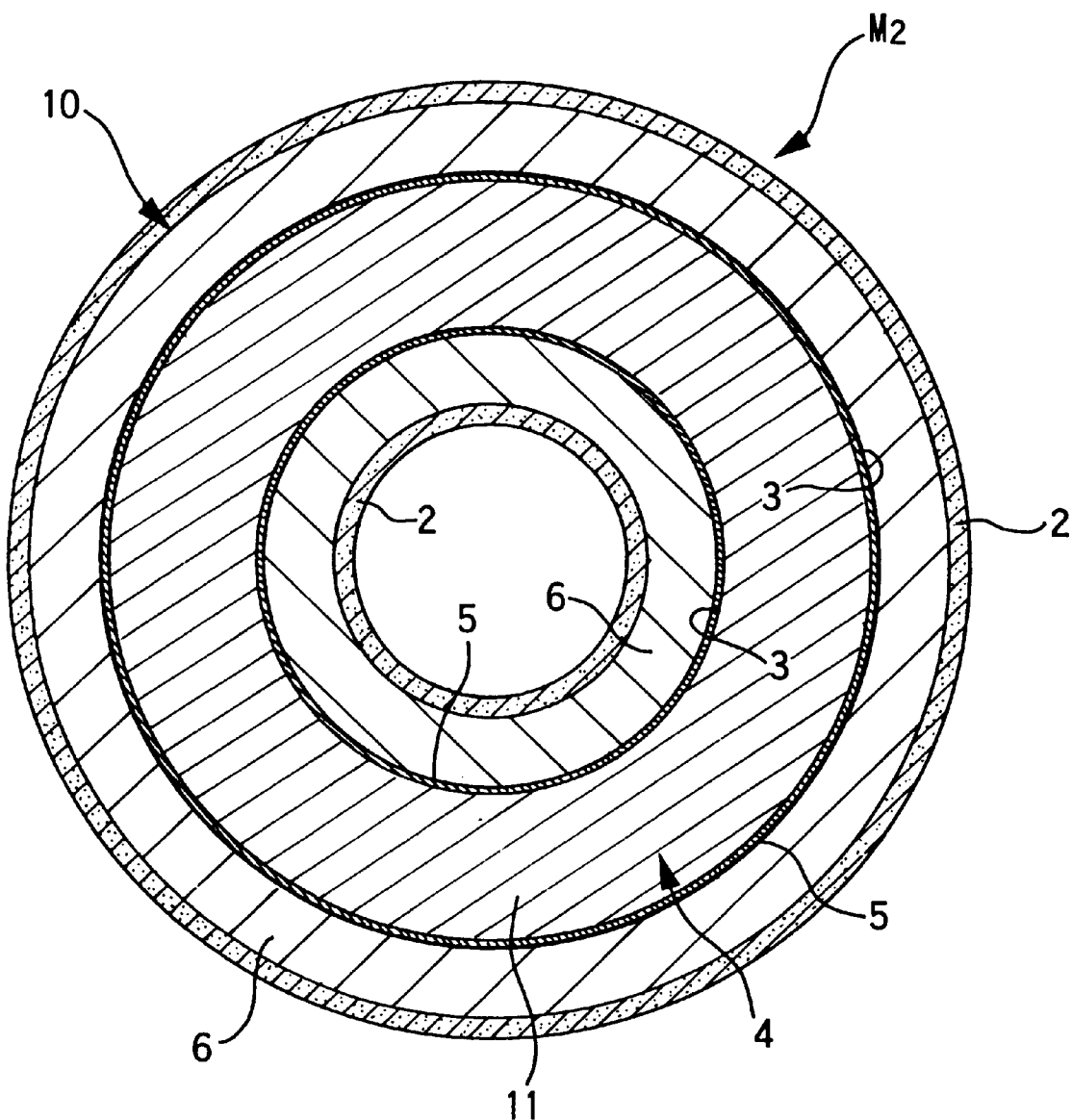
FIG. 7 is a sectional view of a second example of a tubular thermoelectric module.

In the case of the tubular thermoelectric module $M_2$ shown in FIG. 7, the thermoelectric material layer 4 is constituted by arranging ring-like sintered bodies 11 made of Moreover, because solder is not used, it is possible to improve the thermoelectric performance of each of the thermoelectric modules $M_1$ and $M_2$ by raising the operating temperature without being limited by the melting point of the solder.

Furthermore, because the thermoelectric modules $M_1$ and $M_2$ use a small number of parts, the structures are simple, the production costs are low, and the reliability is high.

In addition, because the heat transfer efficiency is high, the thermoelectric modules $M_1$ and $M_2$ can be downsized.

Also, because the thermoelectric modules $M_1$ and $M_2$ can be formed to be flat or tubular, they can be used as components of a heat transfer unit thereby eliminating the need for a heat exchanger. Thus, it is possible to simplify the structure of a heat transfer unit provided with a thermoelectric module.

Examples of the performance of several embodiments and comparative prior art devices will be described below.

The flat thermoelectric module $M_1$ shown in FIGS. 1 and 2 is manufactured as embodiment 1, the tubular thermoelectric module $M_2$ shown in FIGS. 4 to 6 is manufactured as embodiments 2 and 3, and the tubular thermoelectric module $M_2$ shown in FIG. 7 is manufactured as embodiment 4. The layers 4, 5, and 6 are pressure-welded by a pressing method for the embodiment 1, by a rubber pressing method for the embodiments 2 and 3, and by a superplastic extrusion method (plastic forming of ceramic) for the embodiment 4. Moreover, the outer layer 2 is formed by a plasma spraying method.

Table 1 shows the structures of the embodiments 1 to 4.

TABLE 1

Figure 8:
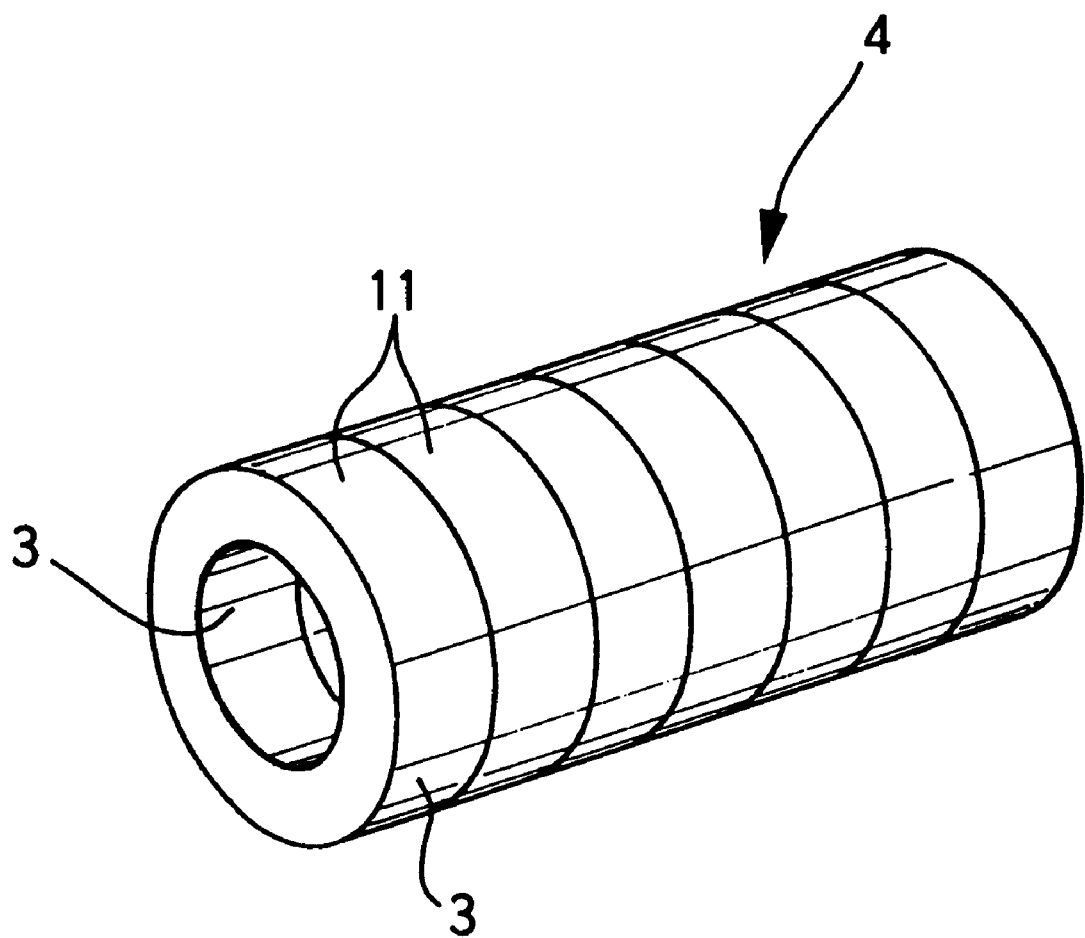
FIG. 8 is a perspective view of a thermoelectric material layer made of an annular sintered body.

| Embodiment | External dimensions (Excluding outer layer) | Thermoelectric material layer | Both electrode layers | Both metallic layers | Outer layer |
|---|---|---|---|---|---|
| 1 | Length: 55 mm Width: 80 mm Thickness: 4 mm | Thin-film layer-built unit with thickness of 2 mm: Conductive layer: Composition: $Si_{0.8}Ge_{0.2}$ Thickness: 50Å Barrier layer: Composition: Si Thickness: 500Å | Cu gauge | Stainless steel plate with thickness of 1 mm (JIS SUS410) | Composition: $Al_2O_3$, Thickness: 0.1 mm |
| 2 | Inside diameter: 36 mm Thickness: 4 mm Length: 200 mm | | | Stainless steel tube with thickness of 1 mm (JIS SUS410) | |
| 3 | Inside diameter: 40 mm Thickness: 4 mm Length: 200 mm | | | | |
| 4 | | Annular sintered body with thickness of 2 mm Composition: $Si_{0.8}Ge_{0.2}$ | | | | one of the above various types of semiconductor in line as shown in FIG. 8. The other structures are the same as those of the tubular thermoelectric module $M_2$ shown in FIGS. 4 to 6.

By constituting the flat and tubular thermoelectric modules $M_1$ and $M_2$ as described above, many benefits are achieved. For example, each of the thermoelectric modules $M_1$ and $M_2$ has an internal resistance depending on the average temperature of the whole of the module and therefore, has a stable thermoelectric performance.

Figure 9:
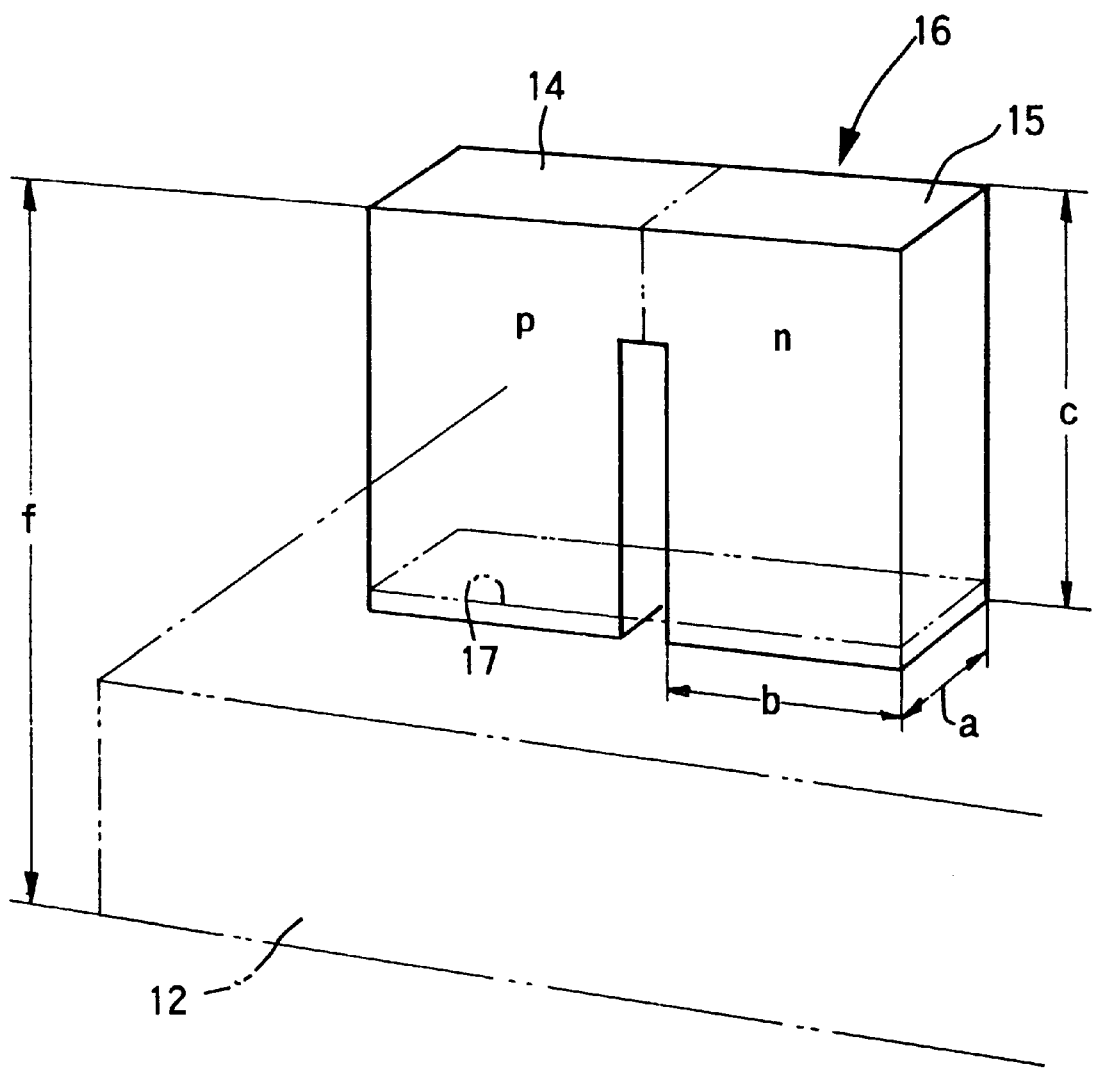
FIG. 9 is a perspective view of an essential portion of a prior art device.
Figure 10:
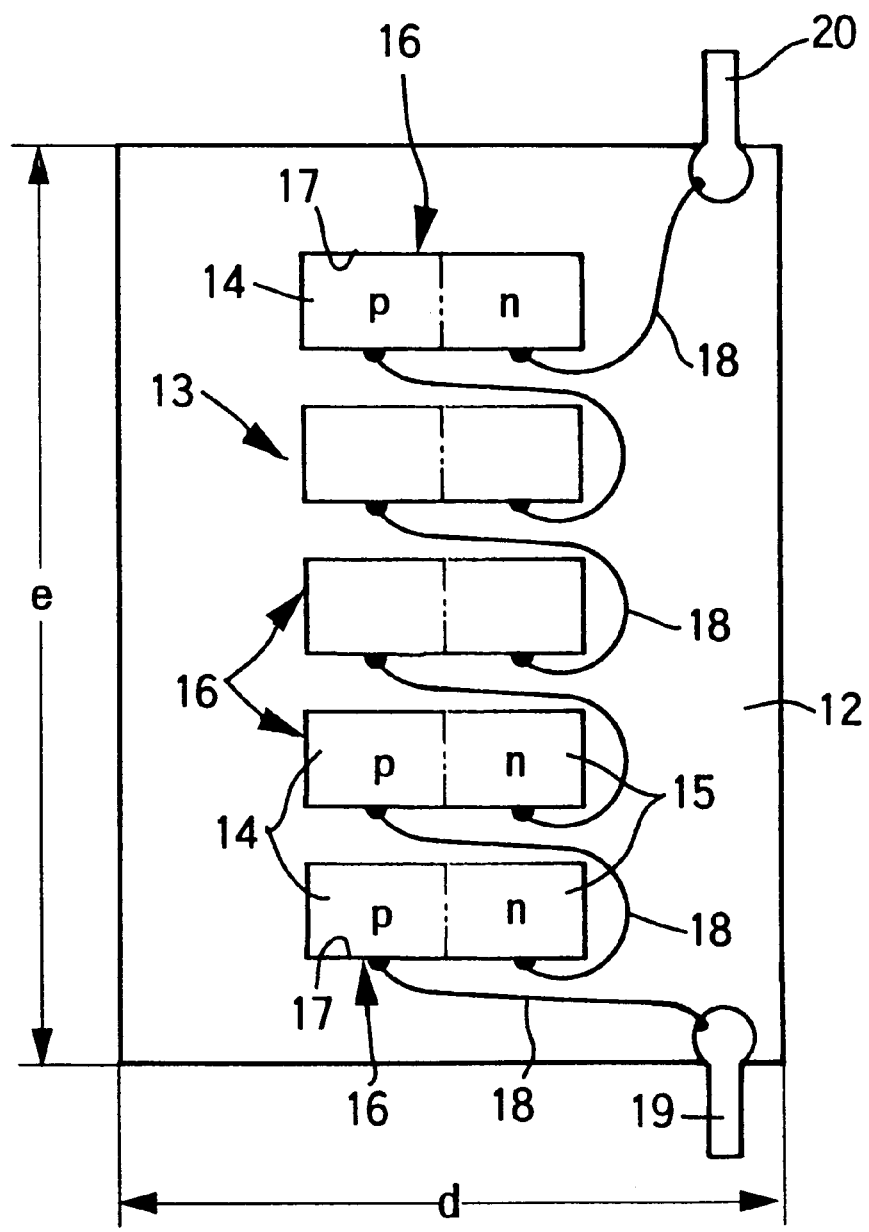
FIG. 10 is a plan view of the device of FIG. 9.

FIGS. 9 and 10 show comparative example 1 which comprises a substrate 12 made of a firebrick and a p-n junction structure 13 provided on the substrate 12. The p-n junction structure 13 is constituted by plugging a plurality of thermoelectric elements 16 made of a p-type semiconductor 14 and an n-type semiconductor 15 into a plurality of blind holes 17 opening in the top of the substrate 12. Both the p-type semiconductor 14 and the n-type semiconductor 15 serve as thermoelectric materials and have the same size. The p-type semiconductor 14 and the n-type semiconductor 15 of adjacent thermoelectric elements 16 are electrically connected to each other by lead wires 18 with solder, as illustrated in FIG. 10. The p-type semiconductor 14 of the thermoelectric element 16 present at one end is connected to a first electrode 19 provided on the substrate 12 by a lead wire 18 with solder. Similarly the n-type semiconductor 15 of the thermoelectric element 16 present at the other end is connected to a second electrode 20 provided on the substrate 12 by a lead wire 18 with solder. An Ni-plating layer is provided for the connection with the lead wires 18 of the p- and n-type semiconductors 14 and 15 in order to improve the wettability of solder.

The p-type semiconductor 14 is a sintered body made of $Si_{0.8}Ge_{0.2}B_{0.003}$ and the n-type semiconductor 15 is a sintered body made of $Si_{0.8}Ge_{0.2}P_{0.002}$. In each thermoelectric element 16, the p- and n-type semiconductors 14 and 15 are joined simultaneously when they are sintered.

Figure 11:
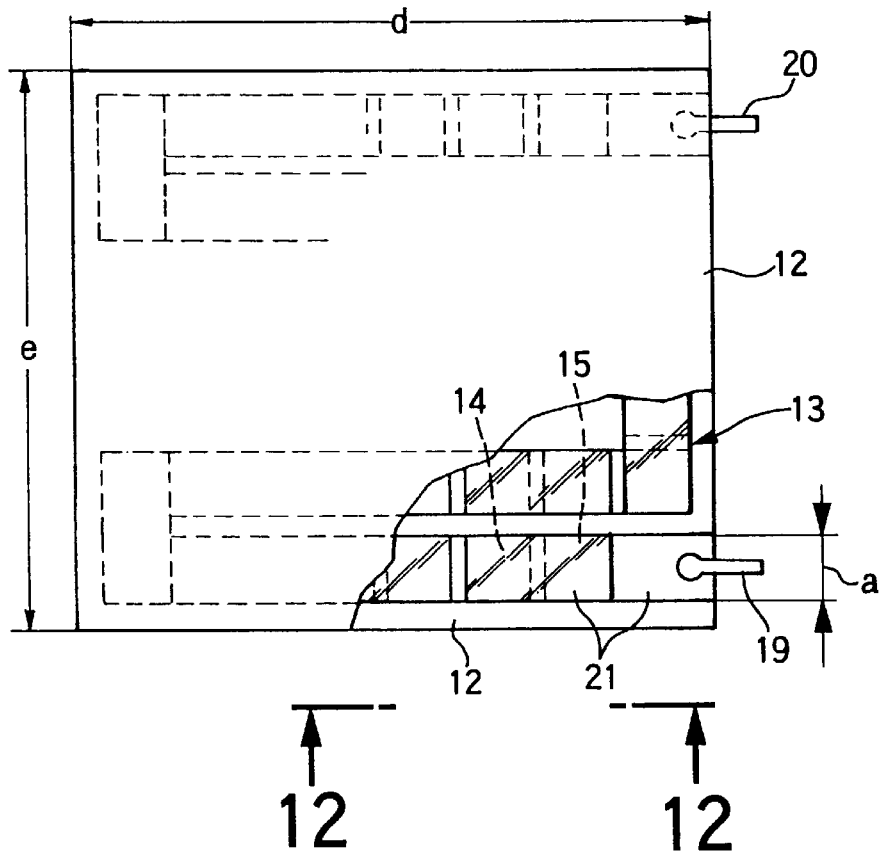
FIG. 11 is a partially cutaway plan view of a second prior art device.
Figure 12:
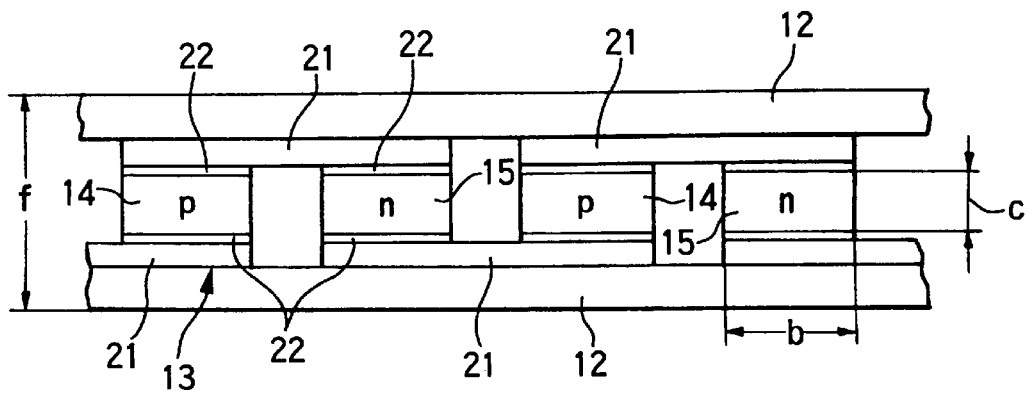
FIG. 12 is a view taken along the line 12—12 in FIG. 11.

FIGS. 11 and 12 show comparative example 2 of a thermoelectric module which comprises a pair of alumina substrates 12 and a p-n junction structure 13 zigzagging between the substrates 12. The p-n junction structure 13 is constituted by alternately arranging in series a plurality of p-type semiconductors 14 and a plurality of n-type semiconductors 15 which serve as thermoelectric materials and have the same size. Adjacent p-type semiconductors 14 and n-type semiconductors 15 are connected by a junction electrode 21 with lead solder. Electrodes 19 and 20 are connected to junction electrodes 21 present at both ends of the p-n junction structure 13 respectively.

The p-type semiconductor 14 is a sintered body made of $(Bi_2Te_3)_{0.25}(Sb_2Te_3)_{0.75}$ and the n-type semiconductor 15 is a sintered body made of $(BiTe)_{0.8}(Bi_2Se_3)_{0.20}$.

Table 2 lists the total numbers, sizes, and cross sections of p-type semiconductors 14 and n-type semiconductors 15 or thermoelectric materials used for the comparative examples 1 and 2, and the size and area of the substrate 12.

Table 3 lists the electric conductivities a of thermoelectric materials used for the embodiments 1 to 4 and comparative examples 1 and 2, measured by the already-known four-terminal method. Table 3 also lists the effective heat-transfer area ratio A of each thermoelectric module.

TABLE 3

|  |  | Electric conductivity σ (S/m) | Effective heat-transfer Area ratio A (%) |
|---|---|---|---|
| Embodiment | 1 | 40000 | 100 |
|  | 2 | 40000 | 100 |
|  | 3 | 40000 | 100 |
|  | 4 | 20000 | 100 |

TABLE 3-continued

|  |  | Electric conductivity σ (S/m) | Effective heat-transfer Area ratio A (%) |
|---|---|---|---|
| Comparative example | 1 | 10000 | 17.3 |
|  | 2 | 60000 | 35.7 |

From Table 3, it is found that the electric conductivities σ of the embodiments 1 to 3 are improved four times larger than those of the comparative example 1 and the electric conductivity σ of the embodiment 4 is improved two times larger than that of the comparative example 1. Though the comparative example 2 has a high electric conductivity σ, it is poor in heat resistance, as described later.

Letting the sum of cross sections of the thermoelectric materials be represented by B and the area of the module by C, the effective heat transfer area ratio A in Table 3 is given by A=(B/C)×100.

Therefore, in the case of the embodiment 1, A is equal to 100% because B=55×80 $mm^2$ and B equals C. Moreover, in the case of the embodiment 2, the cross sections B are equal to the area of the inner periphery of the thermoelectric material layer 4 and thus, equals 38π×200 $mm^2$. Furthermore because the area C of the module is equal to the area of the outer periphery of the inside highly heat-conductive material layer conductive material layer 6 and thus, B equals C, and A equals 100%. The same is true for the embodiments 3 and 4.

In the case of the comparative example 1, because B equals a×b×10=562.5 $mm^2$, and C equals 3,250 $mm^2$, A is equal to (562.5/3,250)×100=17.3%. In the case of the comparative example 2, because B equals a×b×254=571.5 $mm^2$, and because C equals 1,600, A is equal to (571.5×1,600)× 100=35.7%.

Thus, the embodiments 1 to 4 have a very high effective heat-transfer area ratio A compared to the comparative examples 1 and 2, and have a large amount of heat per unit area passing through the thermoelectric material layer 4. Therefore, the embodiments 1 to 4 have a superior heat transfer efficiency.

Then, in the case of the embodiments 1 to 4 and the comparative examples 1 and 2, the thermoelectric performances were measured by the following method.

Figure 13:
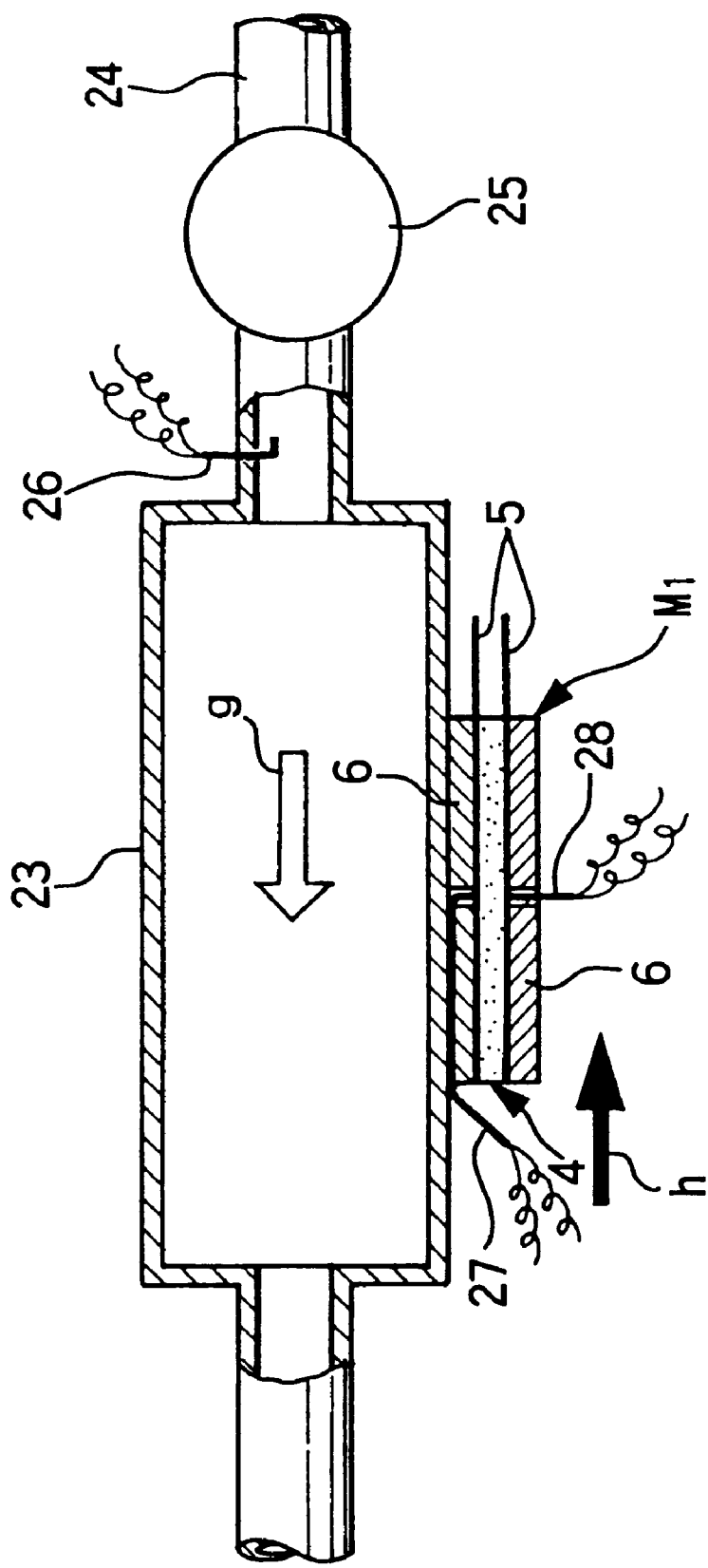
FIG. 13 is an illustration of a first example of a thermoelectric performance measuring method.

In the case of the embodiment 1, the flat thermoelectric module $M_1$ was provided on the bottom outside face of a box chamber 23 as shown in FIG. 13, and a flowmeter 25 was provided in an inlet tube 24 of the chamber 23. Moreover, high-temperature fluid was supplied into the chamber 23 in the direction indicated by arrow g and the outside of the flat thermoelectric module $M_1$ was air-cooled to measure the output of the thermoelectric material layer 4 by using both electrode layers 5.

TABLE 2

| | Thermoelectric material | | | | Module | | | |
|---|---|---|---|---|---|---|---|---|
| Total number of thermoelectric materials used | Size (mm) | | | Cross section | Size (mm) | | | Area |
| | a | b | c | a × b ($mm^2$) | d | E | f | d × e ($mm^2$) |
| Comparative example 1 | 10 | 4.5 | 12.5 | 42 | 56.25 | 50 | 65 | 71 | 3250 |
| Comparative example 2 | 254 | 1.5 | 1.5 | 2.7 | 2.25 | 40 | 40 | 4.6 | 1600 |

The air cooling was performed at a temperature of 20° C. and a wind speed of 11.1 m/sec. Moreover, the direction of cooling air indicated by arrow h was opposite to that of the flow of the high-temperature fluid, as indicated by arrow g. Moreover, the mass flow rate of the high-temperature fluid was measured with the flowmeter 25, the temperature of the high-temperature fluid was measured by one thermocouple 26, and the temperatures on the high- and low-temperature sides of the thermoelectric material layer 4 were measured with two thermocouples 27 and 28. Furthermore, the resistance of the whole of the flat thermoelectric module $M_1$, that is, the total resistance, was obtained from open voltage and open current.

The measuring method for the embodiment 1 was also used for the comparative examples 1 and 2.

Figure 14:
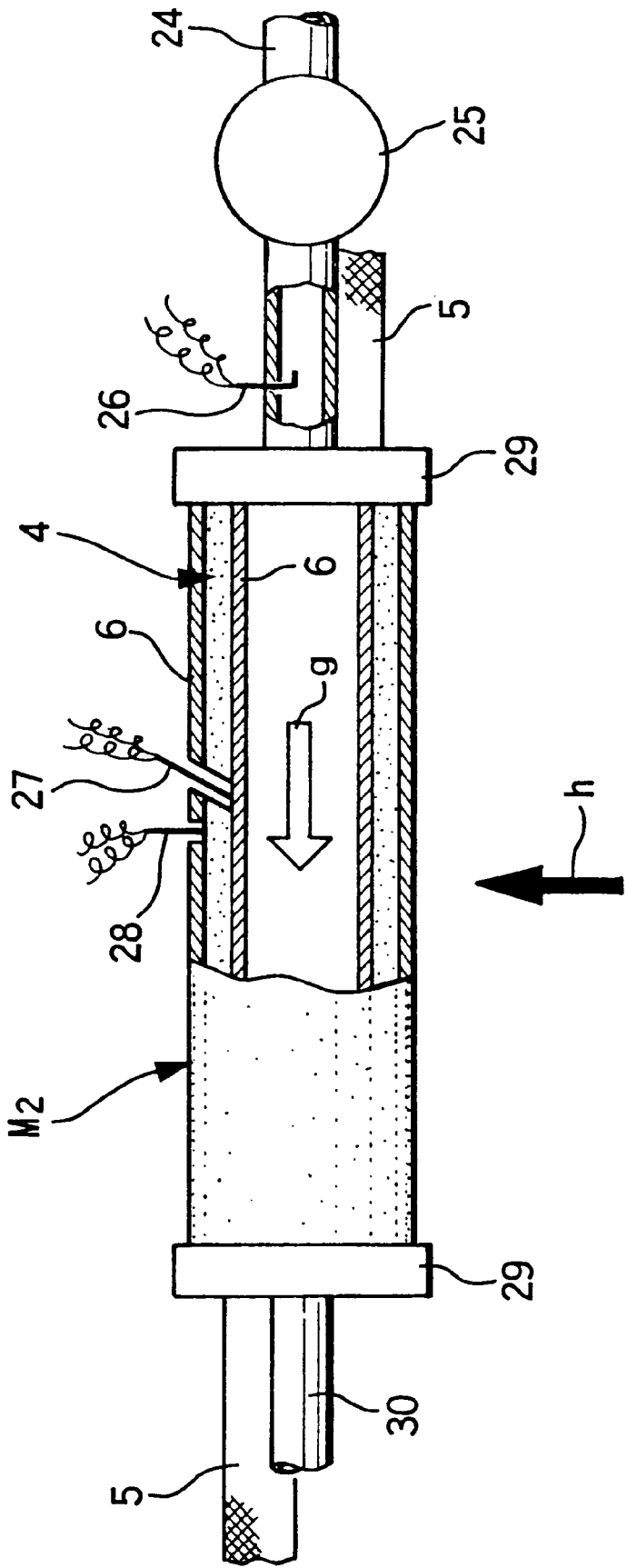
FIG. 14 is an illustration of a second example of a thermoelectric performance measuring method.

In the case of the embodiments 2 to 4, a blocking member 29 having an inlet tube 24 and a blocking member 29 having an outlet tube 30 were provided to either end of the tubular thermoelectric module $M_2$, a flowmeter 25 was provided in the inlet tube, as shown in FIG. 14. Moreover, high-temperature fluid was supplied into the tubular thermoelectric module $M_2$ in the direction indicated by arrow g and the outer periphery of the module $M_2$ was air-cooled to measure the output of the thermoelectric material layer 4 by using both electrode layers 5.

The air cooling was performed at a temperature of 20° C. and a wind speed of 11.1 m/sec and moreover, the direction of flow of cooling air, indicated by arrow h, was made to intersect the direction of the flow of the high-temperature fluid, indicated by arrow g. Moreover, the mass flow rate of the high-temperature fluid was measured with the flowmeter 25, the temperature of the high-temperature fluid was measured with one thermocouple 26, and the temperatures on the high- and low-temperature sides of the thermoelectric material layer 4 were measured with two thermocouples 27 and 28. Furthermore, the resistance, of the whole of the tubular thermoelectric module $M_2$, that is, the total resistance was obtained from the open voltage and the open current.

Tables 4 and 5 show the measured results. Table 4 shows a case where high-temperature water was used as the high-temperature fluid and Table 5 shows a case where high-temperature carbonic acid gas was used as the high-temperature fluid. In Tables 4 and 5, the volumetric flow rate W/K is expressed by W/K=specific heat at constant pressure [J/(kg.K)]×mass flow rate(kg/sec).

TABLE 4

| | | High-temperature fluid High-temperature water | | | Thermoelectric module | | |
| | | | | | Thermoelectric performance | | Heat transfer performance |
| | | Average Temperature (° C.) | Mass flow rate m (kg/sec) | Volumetric flow rate (W/K) | Total resistance (Ω) | Output (W) | Output density (W/m²) | Difference between high temperature and low temperature (° C.) |
|---|---|---|---|---|---|---|---|---|
| Embodiment | 1 | 80 | 0.6 | 2500 | 0.12 | 0.0086 | 2 | 25.9 |
| | 2 | | | | 0.11 | 0.144 | 6.4 | 33.6 |
| Comparative example | 1 | 80 | 0.6 | 2500 | 0.5 | 0.0003 | 0.11 | 10.5 |
| | 2 | | | | 4 | 0.0011 | 0.68 | 21.9 |

TABLE 5

| | | High-temperature fluid High-temperature carbonic acid gas | | | Thermoelectric module | | |
| | | | | | Thermoelectric performance | | Heat transfer performance |
| | | Average Temperature (° C.) | Mass flow rate m (kg/sec) | Volumetric flow rate (W/K) | Total resistance (Ω) | Output (W) | Output density (W/m²) | Difference between high temperature and low temperature (° C.) |
|---|---|---|---|---|---|---|---|---|
| Embodiment | 1 | 600 | 0.008 | 9.2 | 0.09 | 1.2 | 270 | 182 |
| | 3 | | | | 0.07 | 8.8 | 350 | 245 |
| | 4 | | | | 0.1 | 3.4 | 140 | 140 |
| Comparative example | 1 | 600 | 0.008 | 9.2 | 0.45 | 0.01 | 3.6 | 56 |
| | 2 | | | | | Module breakage | | |

From Tables 4 and 5, it is found that the embodiments 1 to 4 are stable for the high-temperature fluids at average temperatures of 80° C. and 600° C. compared to the comparative examples 1 and 2. Embodiments 1 to 4 also have high thermoelectric performances and high heat transfer performances, and their thermoelectric performances are greatly improved as the temperature of high-temperature fluid rises. Embodiments 1 to 4 also meet the requirement that a thermoelectric module have a low resistance, and therefore high electric conductivity.

Figure 15:
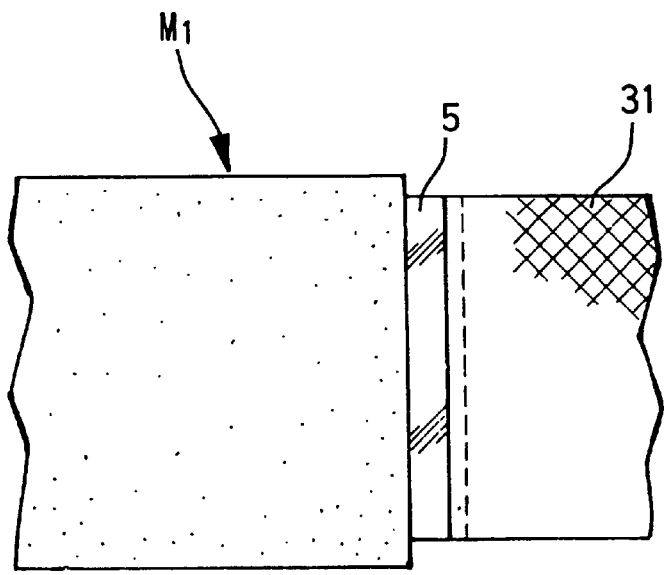
FIG. 15 is a to plan view of an essential portion of a second example of a flat thermoelectric module.

FIG. 15 shows a flat thermoelectric module $M_1$ in which each electrode layer 5 is made of Al foil, and lead wires 31, made of Cu gauze, are connected to the electrode layers 5. This is effective in reducing the production cost of the flat thermoelectric module $M_1$.

Figure 16:
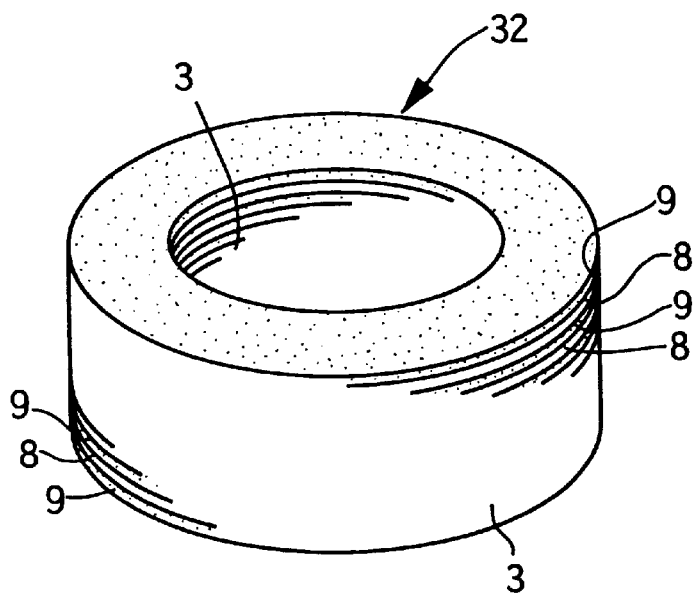
FIG. 16 is a perspective view of an annular thin-film layer-built unit.

FIG. 16 shows an annular thin-film layer-built unit 32 which can be substituted for the annular sintered body 11 in FIG. 8. The annular thin-film layer-built unit 32 can be easily manufactured by punching.

Figure 17:
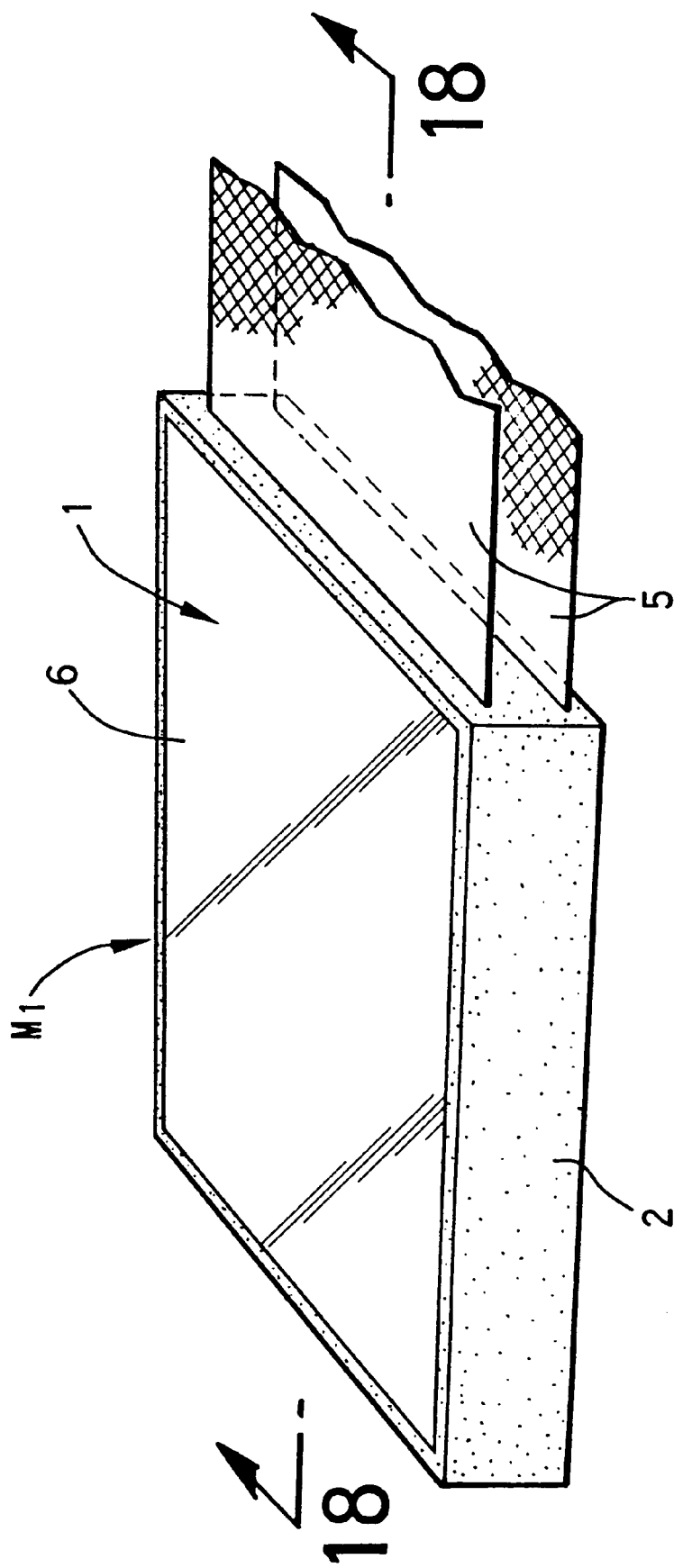
FIG. 17 is a perspective view of a third example of a flat thermoelectric module.
Figure 18:
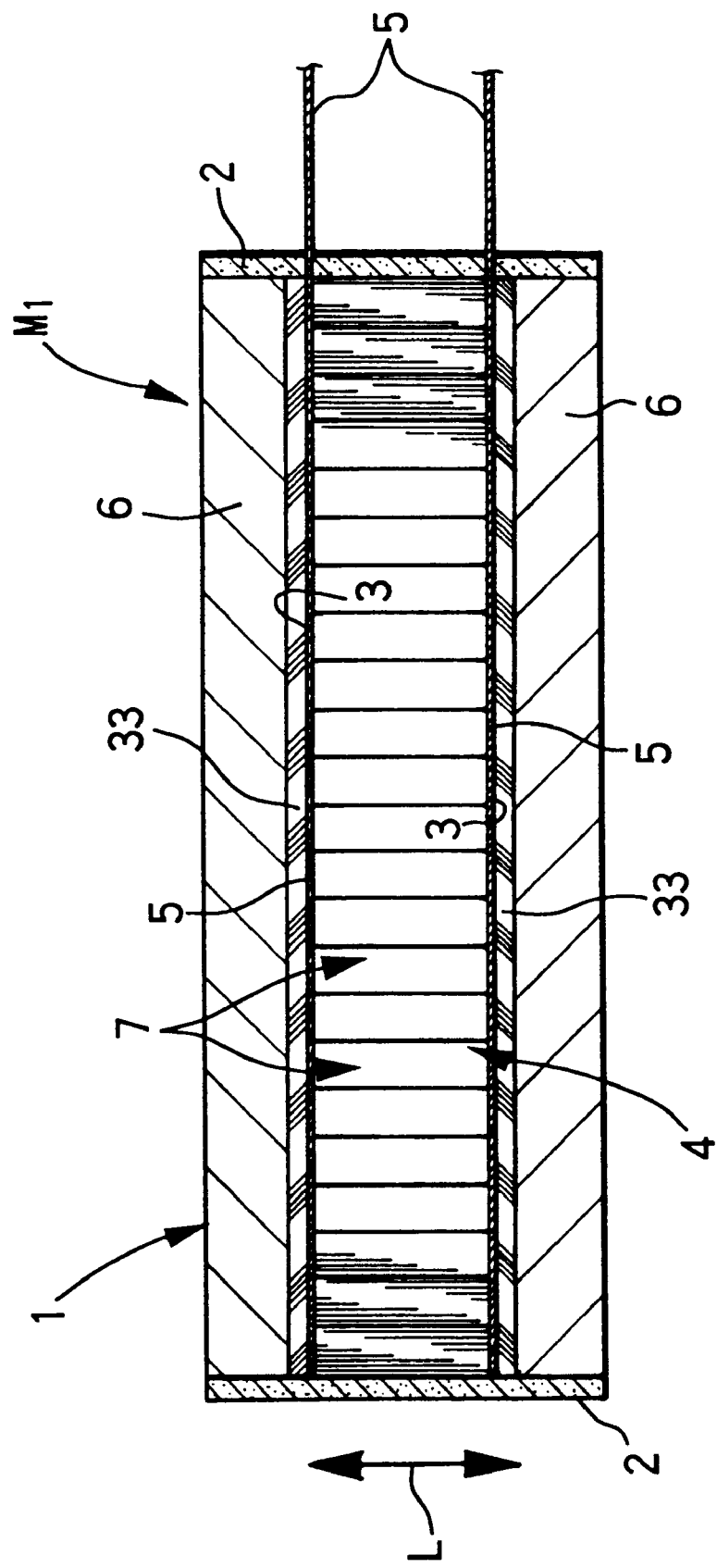
FIG. 18 is a sectional view of the module of FIG. 17, taken along the line 18—18 of FIG. 17.

FIGS. 17 and 18 show a case where, for example, electrical insulating layers 33 made of the same material as the outer layers 2 are provided on the outer side of each of the electrodes 5 respectively in the flat thermoelectric module $M_1$. In this case, the outer layers 2 are partially provided only on the outside faces where layers 4, 5, 6, and 33 of the body 1 are exposed. These electrical insulating layers 33 can be formed by applying, for example, plasma spraying using $Al_2O_3$ to the surfaces of the highly heat conductive material layers 6.

Figure 19:
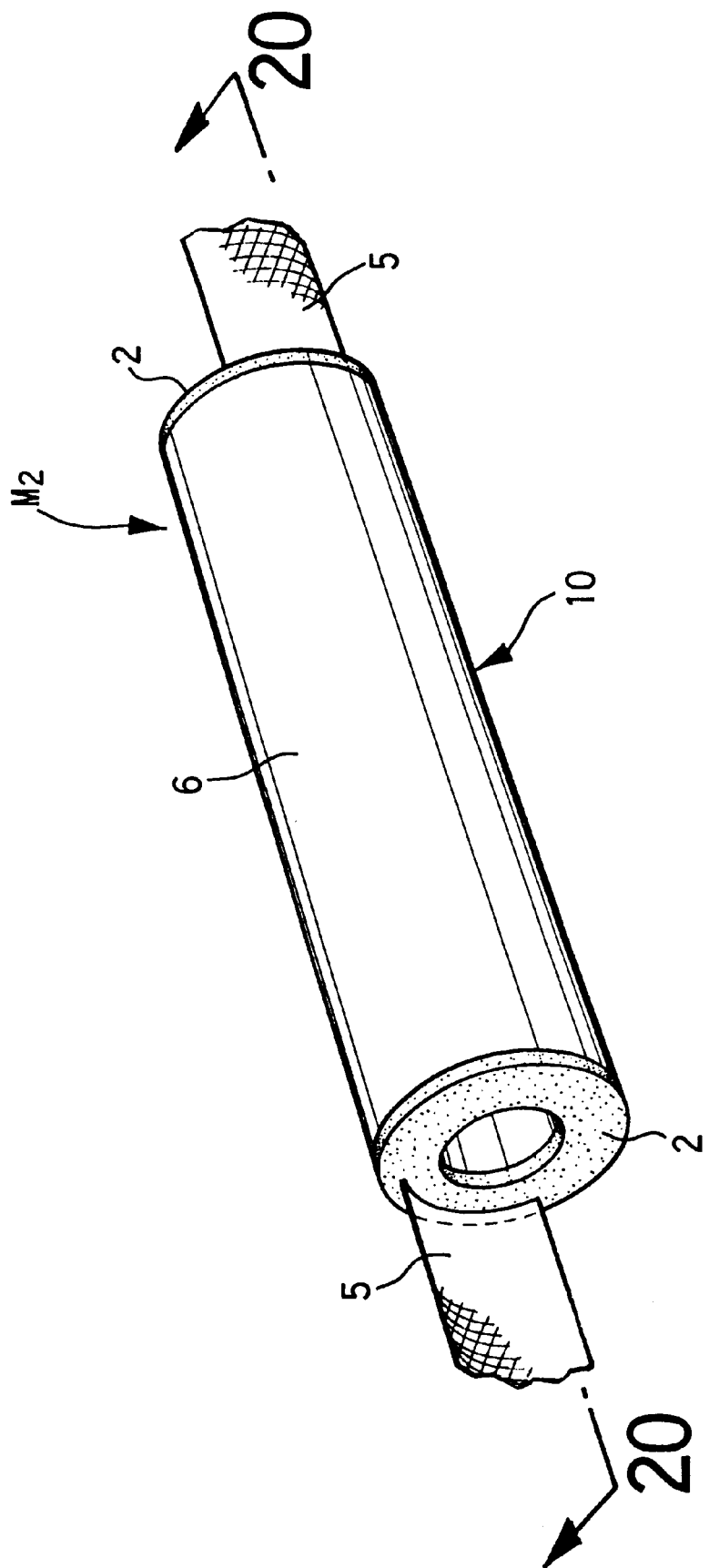
FIG. 19 is a perspective view of a third example of a tubular thermoelectric module.
Figure 20:
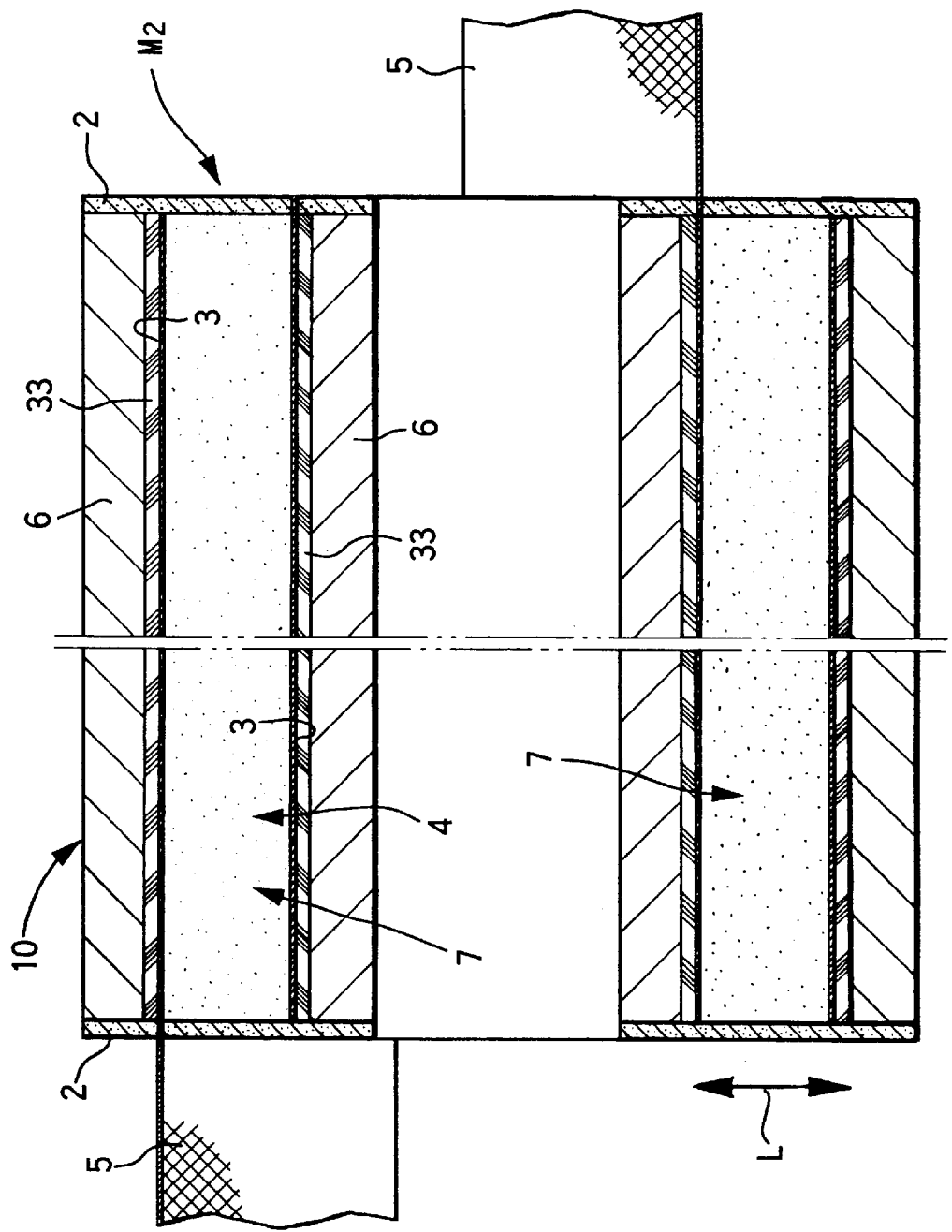
FIG. 20 is a sectional view of the module of FIG. 19, taken along the line 20—20.

FIGS. 19 and 20 show a case where the structure of the module illustrated in FIGS. 17 and 18 is applied to a tubular thermoelectric module $M_2$.

By using the structures of the module illustrated in FIGS. 17 to 20, the outer layer 2 is absent on the highly heat-conductive material layers 6. As a result, it is possible to prevent the outer layer 2 from separating when a thermoelectric module $M_1$ or $M_2$ is installed or when high-temperature fluid strikes the outer layer 2.

Figure 21:
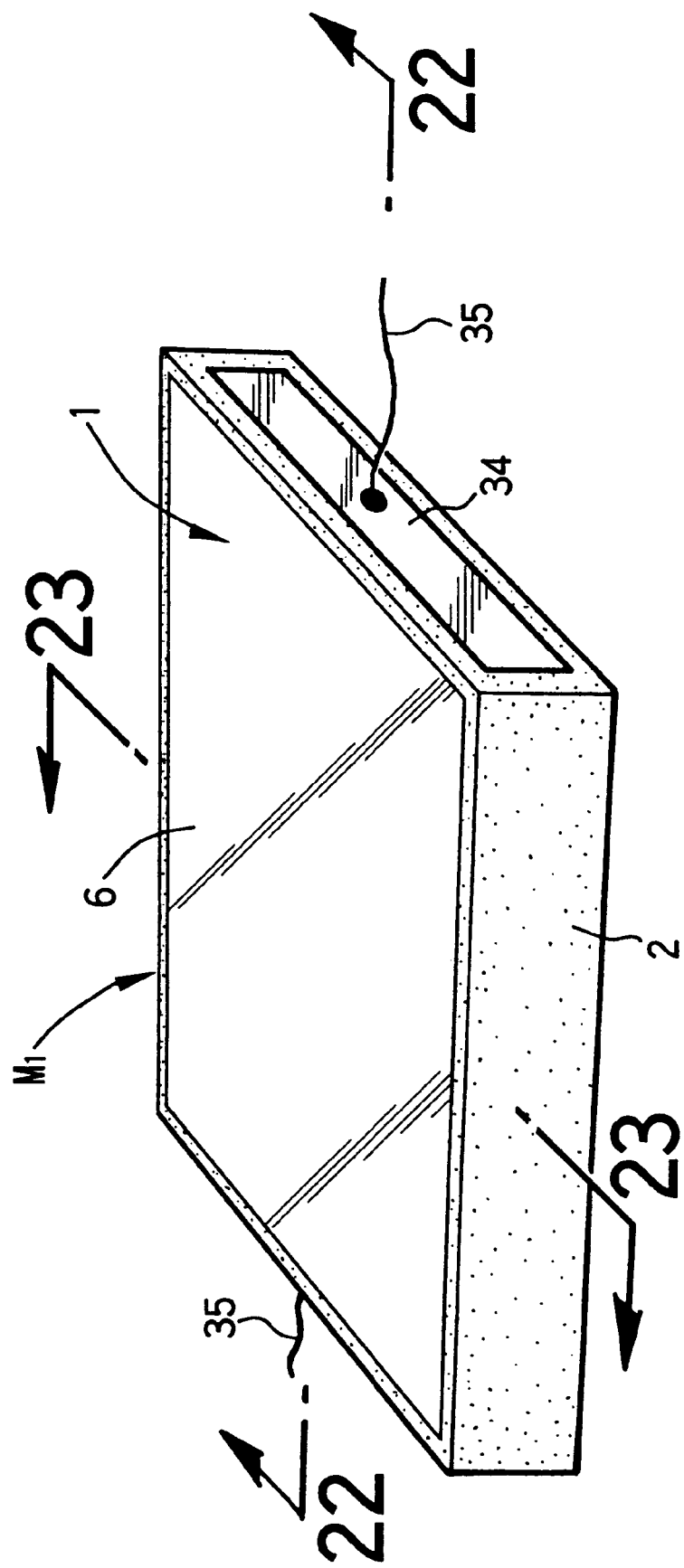
FIG. 21 is a perspective view of a fourth example of a flat thermoelectric module.
Figure 22:
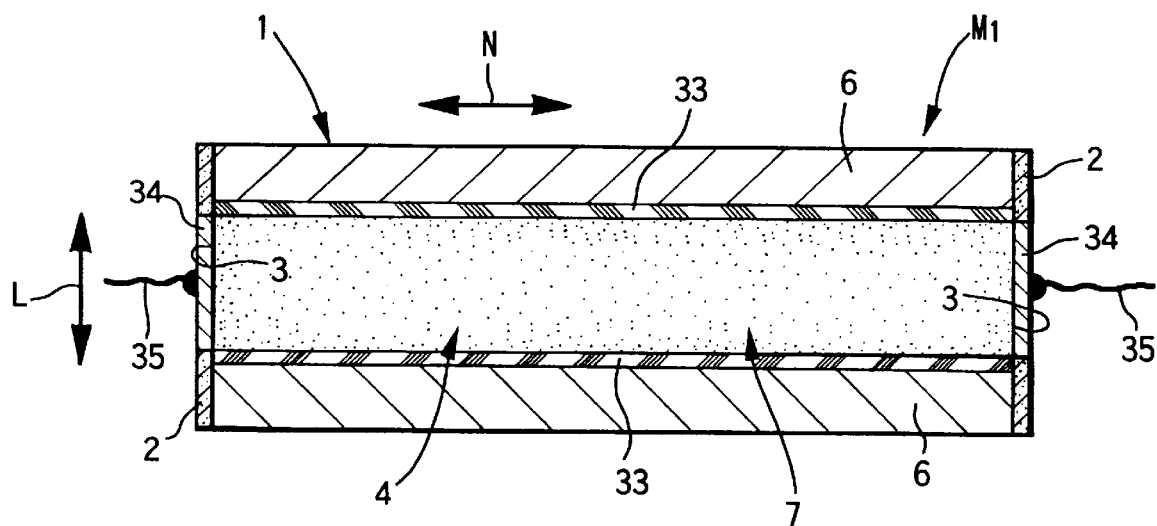
FIG. 22 is a sectional view of the module of FIG. 21, taken along the line 22—22.
Figure 23:
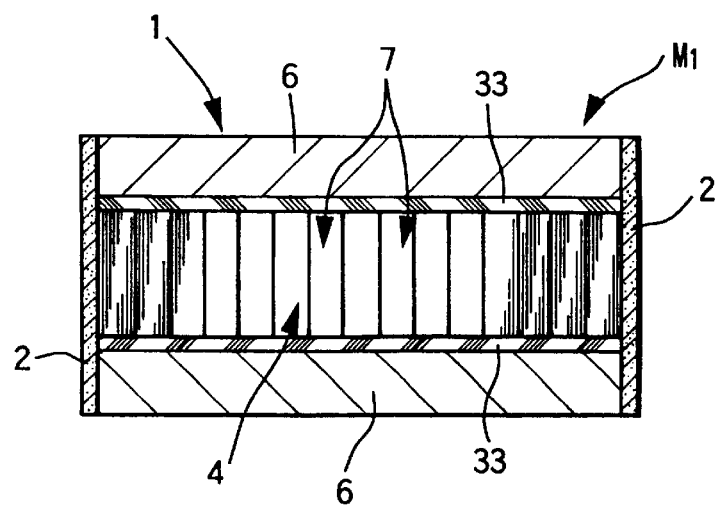
FIG. 23 is a sectional view of the module of FIG. 21, taken along the line 23—23.

A flat thermoelectric module $M_1$ shown in FIGS. 21 to 23 is provided with a flat layer-built body 1 having a rectangular shape when viewed from above. The flat multi-layered body 1 comprises a thermoelectric material layer 4 having output take-out faces 3 on two opposite sides, a pair of electrical insulating layers 33 present on either side of the thermoelectric material layer 4 extending between the output take-out faces 3, and a highly heat-conductive material layer 6 present on each electrical insulating layers 33. Adjacent layers 4, 33 and 33, 6 are directly in close contact with each other by pressure-welding. Electrodes 34 are connected to the output take-out faces 3 of the thermoelectric material layer 4 and are provided on the faces where the layers 4, 33, and 6 of the body 1 are exposed. Electrical insulating outer layers 2 are provided on the same faces of the body as the electrodes 34, thereby covering the faces excluding the portions where the electrodes 34 are provided. A pair of or pairs of lead wires 35 are connected to the electrodes 34. Moreover, it is possible to use Cu gauze for the lead wires 35, as described before in the description of FIG. 15.

The thermoelectric material layer 4 is constituted by arranging a plurality of strip-like thin-film layer-built units 7 in parallel in a line. The output take-out faces 3 are the faces where the layers of the thin-film layer-built units 7 are exposed, and they are in contact with the electrodes 34.

Each electrode 34 is made of an Ni-plating layer and the material of each electrical insulating layer 33 is the same as that of the flat thermoelectric module $M_1$ in FIGS. 17 and 18. Moreover, the materials of each highly heat-conductive material layer 6 and the outer layer 2 are the same as those of the flat thermoelectric module $M_1$ shown in FIGS. 1 and 2.

To use the flat thermoelectric module $M_1$, illustrated in FIGS. 21–23, it is necessary to arrange one electrode 34 on the high-temperature side and the other electrode 34 on the low-temperature side and thereby, produce a temperature gradient in the direction N intersecting the layer-thickness direction L of the thermoelectric material layer 4.

In this case, it is also possible to form the thermoelectric module $M_1$ into a sealed type module by bending the right and left ends of the highly heat-conductive material layers 6 shown in FIG. 22 inward so that the end faces of upper and lower high heat-conductive material layers 6 face each other. In this case, the thermoelectric module $M_1$ becomes more strong.

Figure 24:
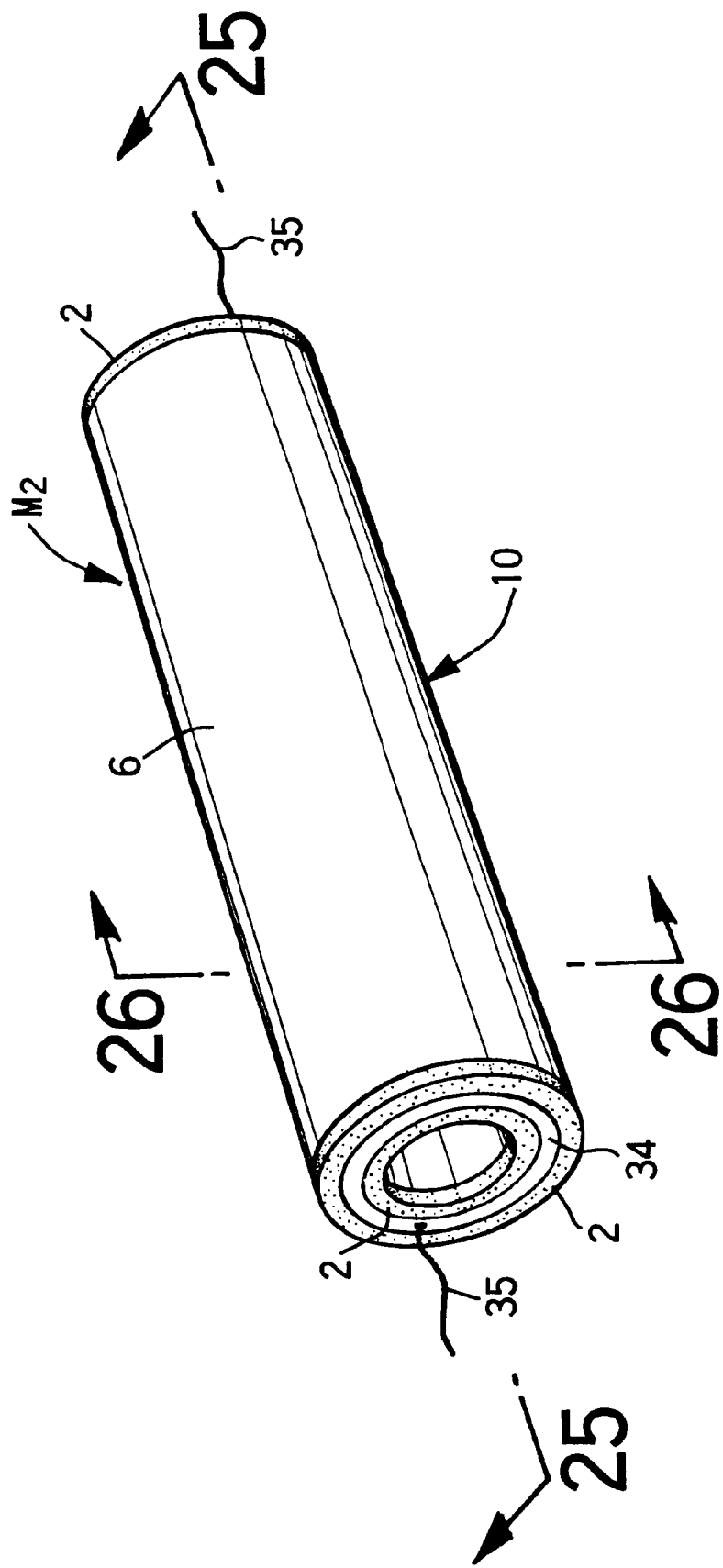
FIG. 24 is a perspective view of a fourth example of a tubular thermoelectric module.
Figure 25:
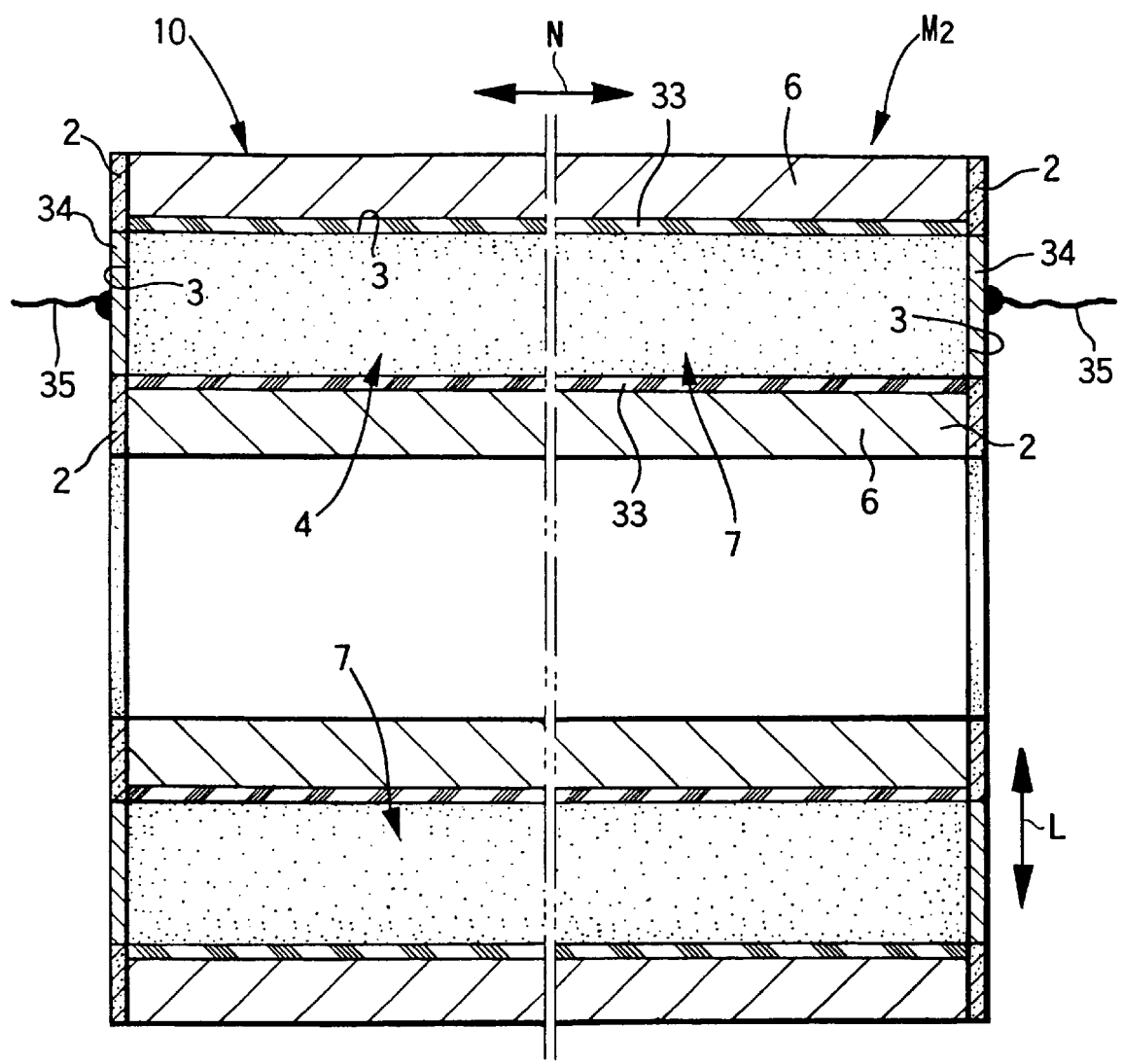
FIG. 25 is a sectional view of the module of FIG. 24, taken along the line 25—25.
Figure 26:
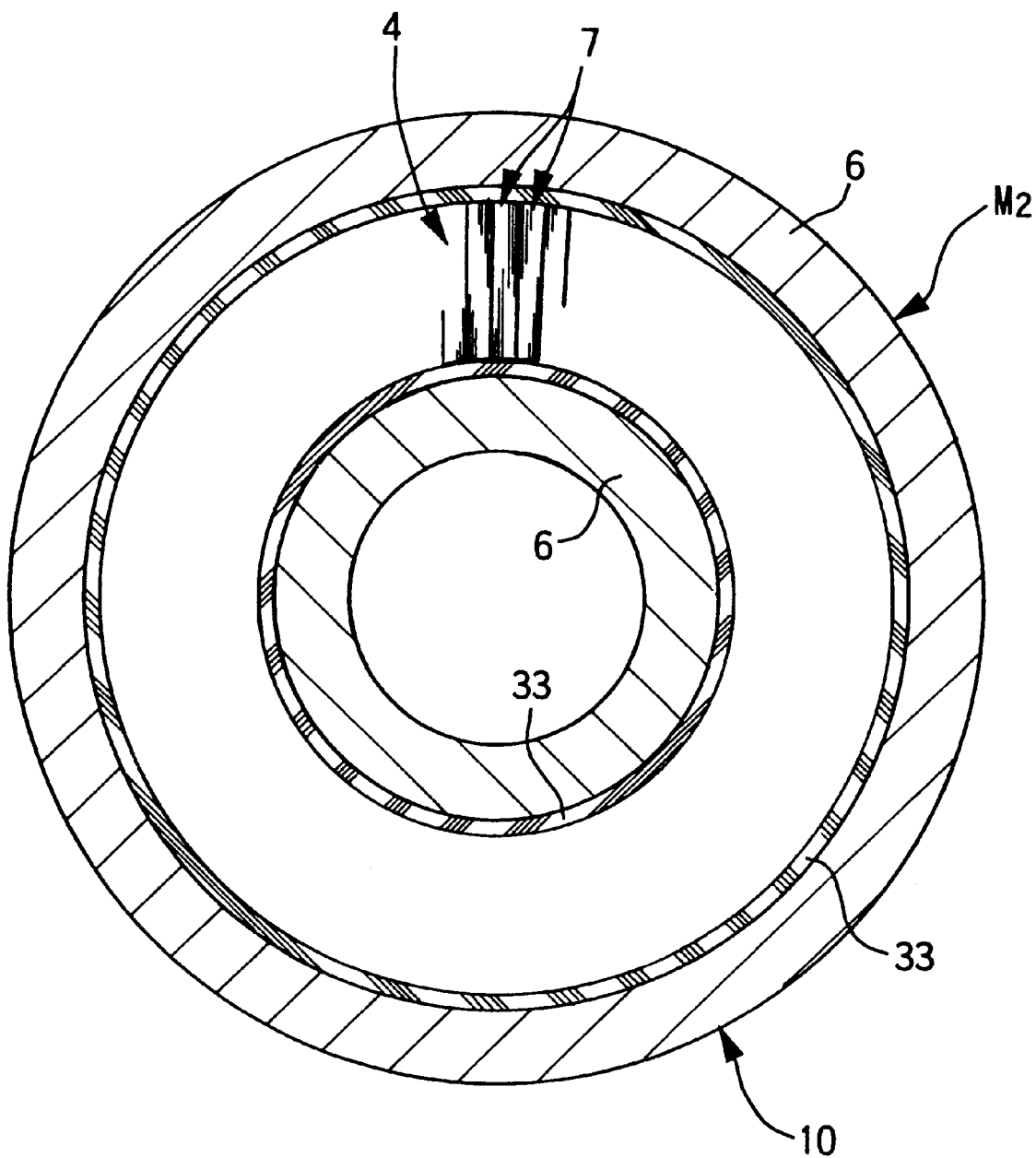
FIG. 26 is a sectional view of the module of FIG. 24, taken along the line 26—26.

FIGS. 24 to 26 show a case where the structure of the module illustrated in FIGS. 21 to 23 is applied to a tubular thermoelectric module $M_2$.

Figure 27:
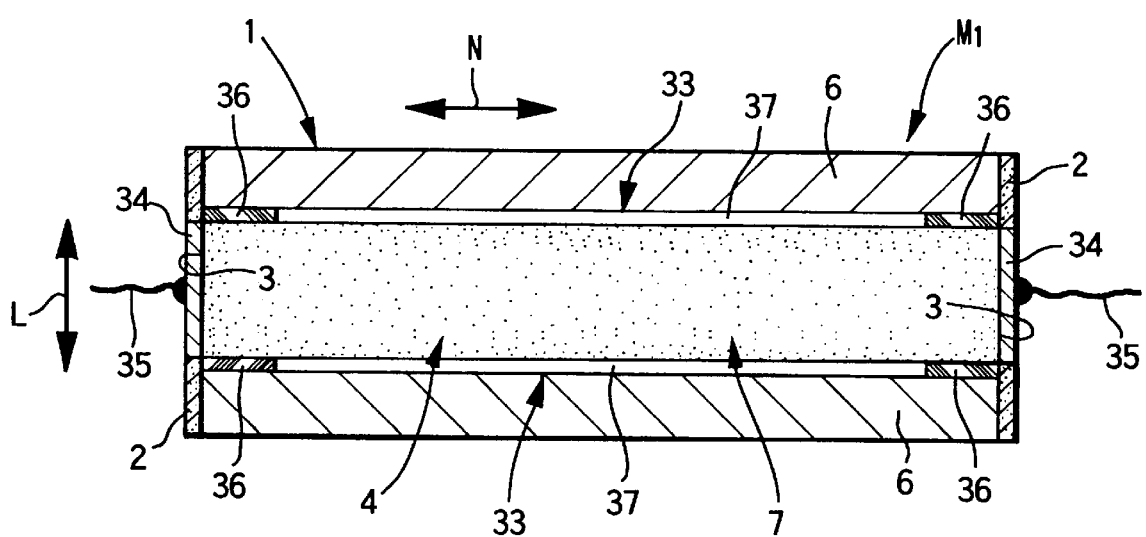
FIG. 27 is a sectional view of a fifth example of a flat thermoelectric module.

FIG. 27 shows an embodiment in which each electrical insulating layer 33 of the flat thermoelectric module $M_1$ of FIGS. 21 to 23 comprises a pair of electrical insulators 36 pressure-welded to the thermoelectric material layer 4 and highly heat-conductive material layer 6, and a gap 37 present between both electrical insulators 36. The material of each electrical insulator 36 is the same as that of each electrical insulating layer 33 of FIGS. 21 to 23.

In this embodiment, most of the material of the electrical insulating layers 33 is eliminated, thereby lowering the cost. It is therefore also possible to reduce the pressure between the thermoelectric material layer 4 and the highly heat-conductive material layers 6 in the production process, thereby improving the quality of the flat thermoelectric module $M_1$.

Figure 28:
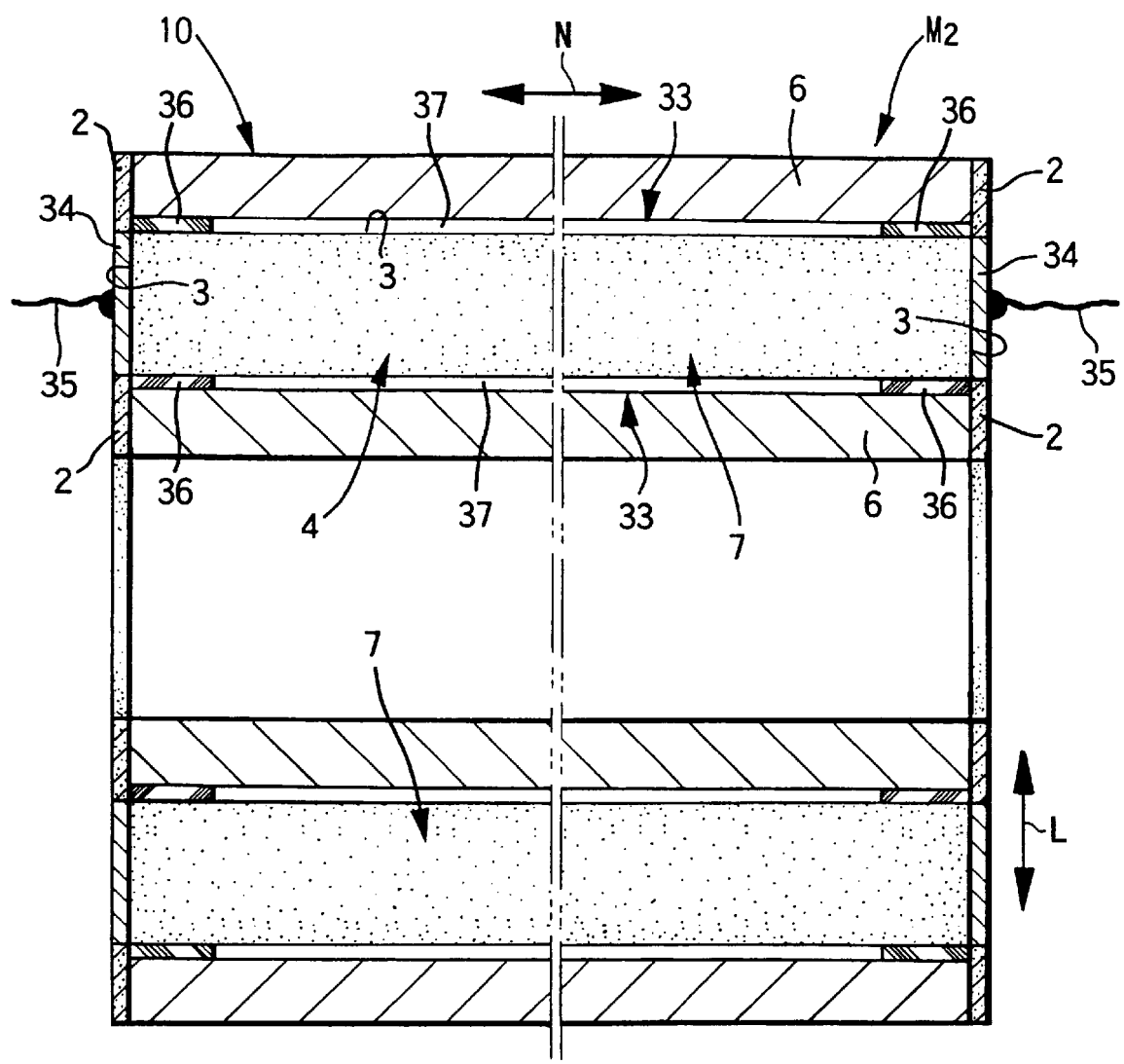
FIG. 28 is a sectional view of a fifth example of a tubular thermoelectric module.

FIG. 28 shows an embodiment where the structure of the module illustrated in FIG. 27 is used for a tubular thermoelectric module $M_2$.

A module provided in accordance with the present invention has been shown to have many advantages. In addition, because an electrical output corresponding to the temperature gradient is taken out from the flat or tubular thermoelectric modules $M_1$ and $M_2$, the number of restrictions, including the installation direction, are decreased. As a result, the degree of freedom for design is heightened.

FIGS. 29 to 32 show examples in which the flat thermoelectric module $M_1$ of FIGS. 1 and 2 and the tubular thermoelectric module $M_2$ of FIGS. 4 to 7 are used as a thermoelectric generator.

Figure 29:
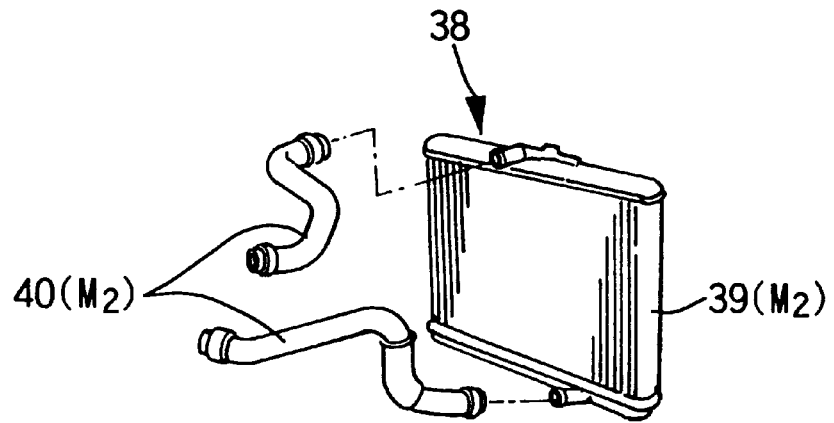
FIG. 29 is a perspective view of a car radiator incorporating a module provided in accordance with the present invention.

In the case of FIG. 29, the module $M_2$ forms at least a part of the flat cooling-water tube 39 of a radiator body 38 and at least a part of cooling-water supply and discharge pipes 40 of a car radiator.

Figure 30:
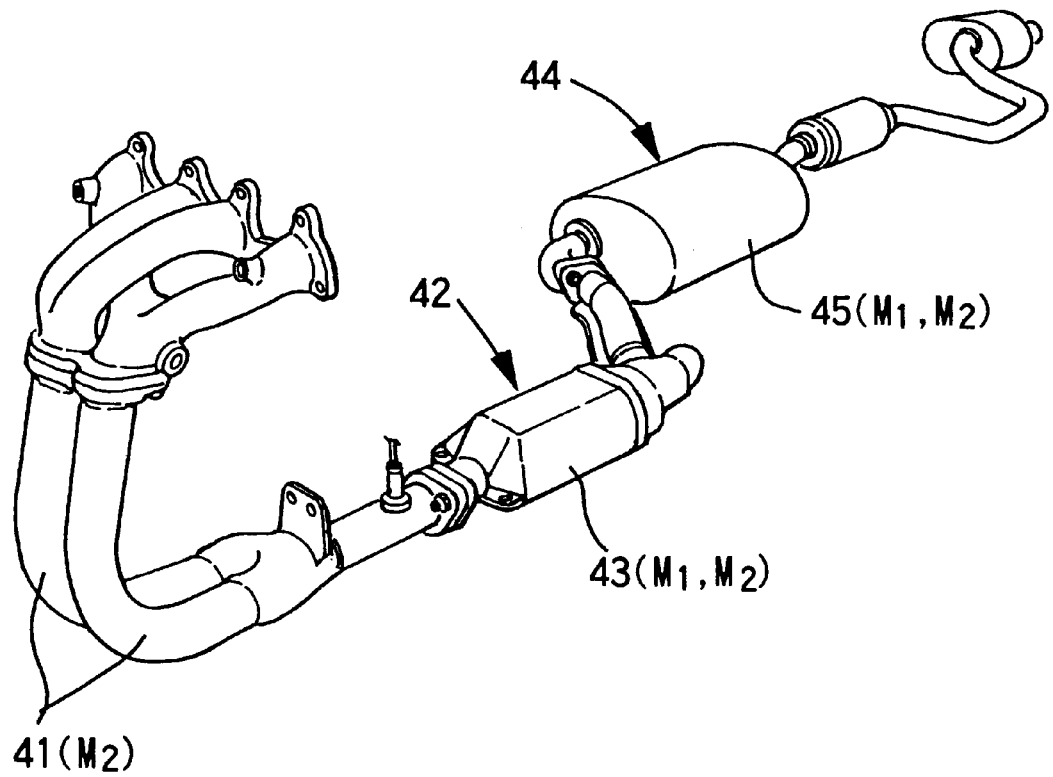
FIG. 30 is a perspective view of a car exhaust system incorporating a module provided in accordance with the present invention.

In the case of FIG. 30, the tubular thermoelectric module $M_2$ constitutes at least a part of an exhaust pipe 41, the casing 43 of a catalyst converter 42, and the casing 45 of a muffler 44 in the exhaust system of a car engine. In this case, it is also possible to apply a flat thermoelectric module $M_1$ to the casings 43 and 45. Moreover, it is possible to provide a tubular thermoelectric module $M_2$ in the casing 43 of the catalytic converter 42 so as to enclose a honeycomb core.

Figure 31:
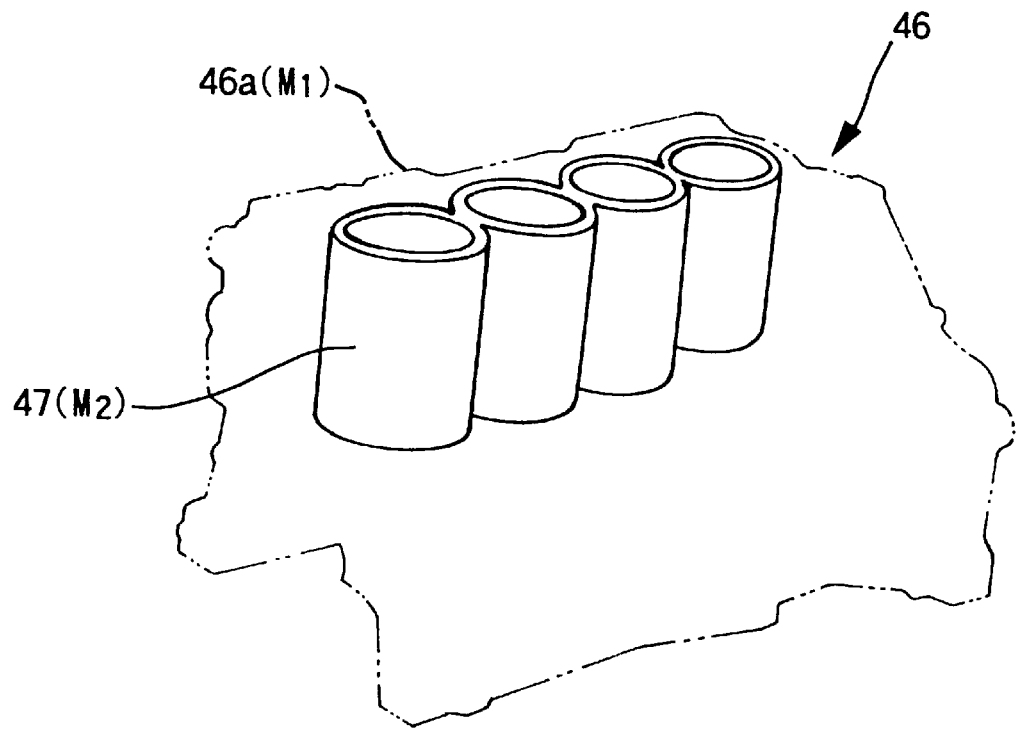
FIG. 31 is a partially cutaway perspective view of an essential portion of a car engine incorporating a module provided in accordance with the present invention.

In the case of FIG. 31, a tubular thermoelectric module $M_2$ is provided on the outer periphery of the cylinder sleeve 47 of an engine 46. In this case, it is also possible to allow the inside highly heat-conductive material layer 6 to serve also as the cylinder sleeve 47. Moreover, a flat thermoelectric module $M_1$ is provided to an engine block 46a.

Figure 32:
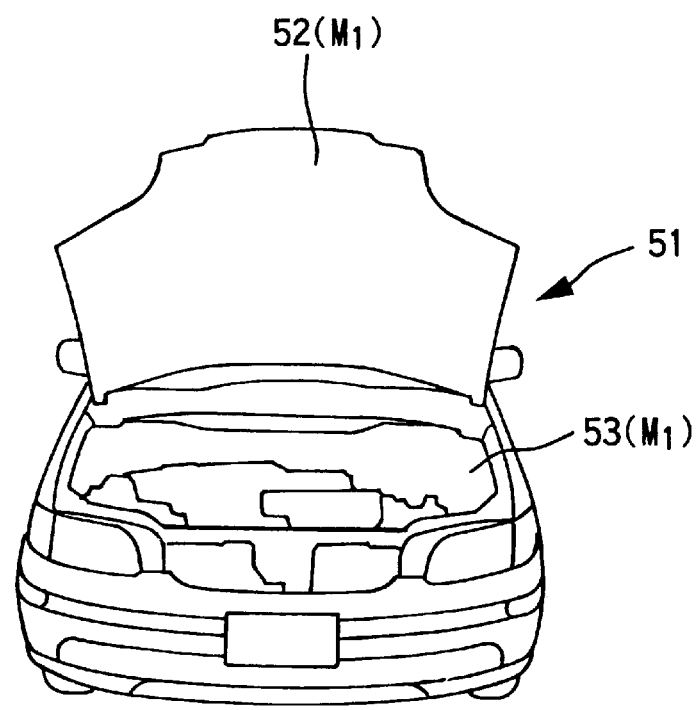
FIG. 32 is a perspective view of a car incorporation a module provided in accordance with the present invention.

In the case of FIG. 32, a flat thermoelectric module $M_1$ is provided on the hood 52 and tow board 53 of a car 51.

Figure 33A:
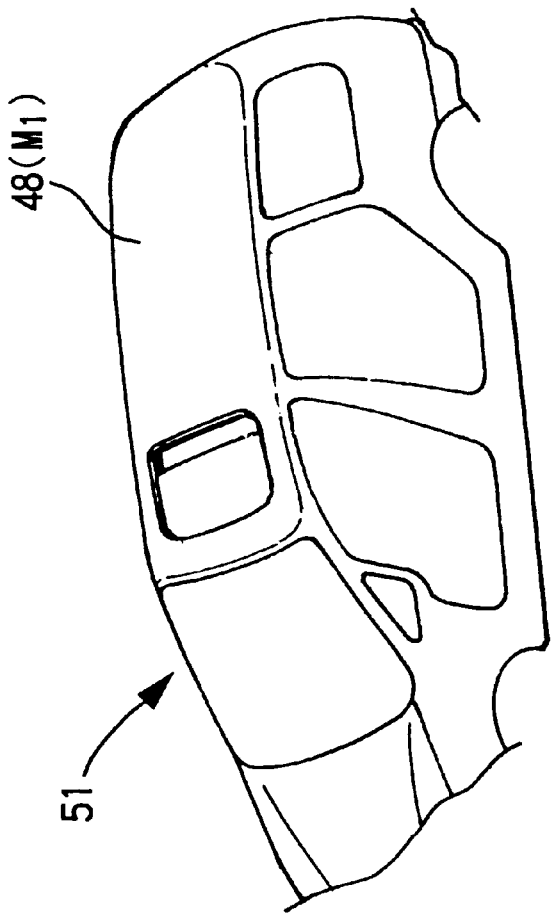
FIGS. 33A, 33B and 33C are perspective views of the body of a car, illustrating possible uses for a module provided in accordance with the present invention.
Figure 33B:
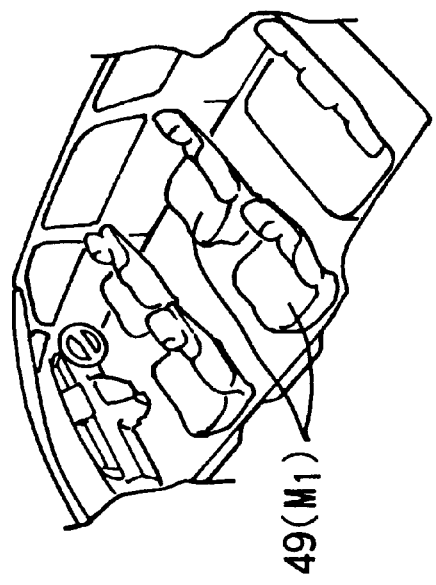
Figure 33C:
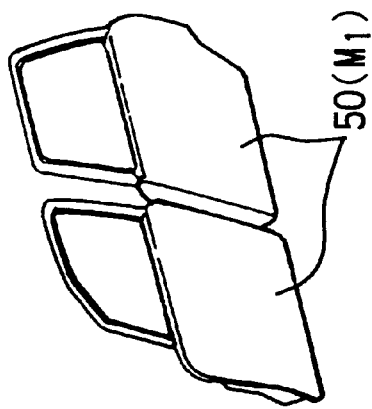

FIGS. 33A to 33C show a case where a flat thermoelectric module $M_1$ is provided on the body and interior of a car and performs thermoelectric cooling or thermoelectric heating. FIG. 33A shows the flat thermoelectric module $M_1$ provided to the inside of a roof panel 48, FIG. 33B shows the module $M_1$ provided to the inside of seats 49, and FIG. 33C shows the module $M_1$ provided to the inside of doors 50.

Moreover, a thermoelectric module for performing thermoelectric power generation can be applied to heat exchangers in general-purpose generators, power stations, incineration plants, iron mills, and chemical plants (for example, see "DENNETSU KOGAKU SHIRYO (Heat Transfer Engineering Information)", fourth edition, (1989), 244, compiled by the Japan Society of Mechanical Engineers, published by Maruzen Co., Ltd.). Such a thermoelectric module may also be used in various types of furnace walls, electrode cooling-water tubes of fuel cells, housing cooling-water tubes of electric motors, and cooling-water tubes of secondary batteries.

Furthermore, a thermoelectric module for performing thermoelectric cooling or thermoelectric heating can be applied to an inner wall, roof, floor, door panel, seat for crew in a crew cabin or a machinery room of cars, ships, air planes and so on; and helmets, jackets, and boots for crew.

Furthermore, a thermoelectric module for performing temperature control can be applied to the ceiling, wall, floor, roof, and outer wall of a house and outer wall of a tank of natural gas or the like.

Furthermore, the following are examples of the multiple uses of power generation, cooling, and heating functions of a thermoelectric module: (a) thermo-electric power generation and thermoelectric cooling are performed when a radiator, catalyst, and secondary battery produce heat in an almost normal state and thermoelectric heating is performed to heat the units concerned when operation is unstable, for example, at a low-start temperature; and (b) thermoelectric power generation and thermoelectric cooling are performed when the roof and outer wall of a car body or house and the outer wall of a tank are heated to high temperatures by sunlight, whereas thermoelectric heating is performed in order to heat them when the outside air temperature is low.

As described above, it is possible to directly bring the thermoelectric modules $M_1$ and $M_2$ into contact with the above various types of high-temperature heat sources by forming the modules $M_1$ and $M_2$ into a flat shape or tubular shape. It is therefore possible to improve the heat transfer performance and thermoelectric performances of the thermoelectric modules $M_1$ and $M_2$.

A thermoelectric module having high thermoelectric performance, a simple structure, and a low production cost has been shown and described. From the foregoing, it will be appreciated that although embodiments of the invention have been described herein for purposes of illustration, various modifications may be made without deviating from the spirit of the invention. Thus, the present invention is not limited to the embodiments described herein, but rather is defined by the claims which follow.

What is claimed is:

1. A thermoelectric module comprising:
a multi-layered body provided with a tubular thermoelectric material layer having inner and outer cylindrical surfaces, an electrode layer adjacent each cylindrical surface, and a highly heat conductive material layer adjacent each electrode layer, the thermoelectric material layer, the electrode layers and the highly heat conductive material layers being in close contact with each other, and an electrical insulating outer layer covering a face of the multi-layered body, wherein the thermoelectric material layer comprises only one of a p-type semiconductor or an n-type semiconductor.

2. The thermoelectric module according to claim 1 wherein the thermoelectric material layer further comprises a plurality of multi-layered thin-film units, each multi-layered thin-film unit having a plurality of alternately superposed conductive layers and barrier layers.

3. The thermoelectric module according to claim 1 wherein the thermoelectric material layer is a sintered body comprising the only one of a p-type semiconductor or an n-type semiconductor.

4. The thermoelectric module according to claim 1 wherein the electrode layers protrude from the electrical insulating outer layer to serve as lead wires.

5. The thermoelectric module according to claim 1 wherein a first highly heat conductive material layer is in contact with a heat source, and a second highly heat conductive material layer is in contact with means for cooling, such that a temperature gradient exists through the thickness of the thermoelectric material layer.

6. The thermoelectric module of claim 1, wherein the thermoelectric material layer comprises a plurality of strip-shaped thin-built units comprising one of a p-type or an n-type semiconductor, the strip-shaped thin-built units being radially disposed in parallel between the inner and outer surfaces.

7. The thermoelectric module of claim 1, wherein the thermoelectric material layer comprises a plurality of ring-shaped bodies comprising one of a p-type or an n-type semiconductor, the ring-shaped bodies being disposed between the inner and outer surfaces.

8. The thermoelectric module of claim 1, wherein the thermoelectric material layer comprises:
a plurality of thin-built units comprising one of a p-type or an n-type semiconductor, the thin-built units being disposed in parallel between the inner and outer surfaces; and
a barrier layer disposed between adjacent thin-built units.

9. A thermoelectric module comprising:
a multi-layered body provided with a tubular thermoelectric material layer having a first cylindrical surface and a second cylindrical surface on two opposite sides, a first electrode layer adjacent to the first cylindrical surface and a second electrode layer adjacent to the second cylindrical surface, a first electrical insulating layer adjacent to the first electrode layer and a second electrical insulating layer adjacent to the second electrode layer, a first highly heat conductive material layer adjacent to the first electrical insulating layer, a second highly heat conductive material layer adjacent to the second electrical insulating layer, the adjacent layers being in close contact with each other, and an electrical insulating outer layer covering a face of the body where the thermoelectric material layer, the electrode layers, the electrical insulating layers, and the highly heat conductive material layers are exposed, wherein the thermoelectric material layer comprises only one of a p-type semiconductor or an n-type semiconductor.

10. The thermoelectric module according to claim 9 wherein the thermoelectric material layer further comprises a plurality of multi-layered thin-film units, each multi-layered thin-film unit having a plurality of alternately superposed conductive layers and barrier layers.

11. The thermoelectric module according to claim 9 wherein the thermoelectric material layer is a sintered body comprising the only one of a p-type semiconductor or an n-type semiconductor.

12. The thermoelectric module according to claim 9 wherein the electrode layers protrude from the electrical insulating outer layer to serve as lead wires.

13. The thermoelectric module according to claim 9 wherein the first highly heat conductive material layer is in contact with a heat source, and the second highly heat conductive material layer is in contact with means for cooling, such that a temperature gradient exists through the thickness of the thermoelectric material layer.

14. A thermoelectric module comprising:

a multi-layered body provided with a tubular thermoelectric material layer having two cylindrical surfaces provided on opposite sides of the body, a pair of electrical insulating layers provided on opposite sides of the thermoelectric material layer and extending between the two surfaces, and a pair of highly heat conductive material layers provided adjacent to the electrical insulating layers, the adjacent thermoelectric material layer, electrical insulating layers and highly heat conductive material layers being in close contact with each other, an electrode connected to each of the two cylindrical surfaces, and an electrical insulating outer layer covering each of the surfaces excluding a region where the electrode is provided, wherein the thermoelectric material layer comprises only one of a p-type semiconductor or an n-type semiconductor.

15. The thermoelectric module according to claim 14 wherein the thermoelectric material layer further comprises a plurality of multi-layered thin-film units, each multi-layered thin-film unit having a plurality of alternately superposed conductive layers and barrier layers.

16. The thermoelectric module according to claim 14 wherein the thermoelectric material layer is a sintered body comprising the only one of a p-type semiconductor or an n-type semiconductor.

17. The thermoelectric module according to claim 14 wherein the electrode layers protrude from the electrical insulating outer layer to serve as lead wires.

18. The thermoelectric module according to claim 14 wherein a first highly heat conductive material layer is in contact with a heat source, and a second highly heat conductive material layer is in contact with means for cooling, such that a temperature gradient exists through the thickness of the thermoelectric material layer.

19. The thermoelectric module according to claim 14 wherein each of the electrical insulating layers includes a pair of insulators positioned between the thermoelectric material layer and one of the highly heat conductive material layers, the electrical insulators being separated by a longitudinal gap.

20. A thermoelectric module comprising:

a multi-layered body provided with a tubular thermoelectric material layer having two cylindrical surfaces on two opposite sides of the body, the thermoelectric material layer comprising only one of a p-type semiconductor or an n-type semiconductor, and a highly heat conductive material layer adjacent each of the cylindrical surfaces, the thermoelectric material layer and the highly heat conductive material layers being in close contact with each other, and an electrical insulating outer layer covering a face of the multi-layered body.

* * * * *